(12) United States Patent
Pandey et al.

(10) Patent No.: US 11,217,662 B2
(45) Date of Patent: Jan. 4, 2022

(54) SEMICONDUCTOR NANOCRYSTALS

(71) Applicant: Indian Institute of Science, Bangalore (IN)

(72) Inventors: Anshu Pandey, Bangalore (IN); Biswajit Bhattacharyya, Bangalore (IN); Guru Pratheep Rajasekar, Bangalore (IN); Amit Kumar Simlandy, Bangalore (IN)

(73) Assignee: INDIAN INSTITUTE OF SCIENCE, Bangalore (IN)

( * ) Notice: Subject to any disclaimer, the term of this patent is extended or adjusted under 35 U.S.C. 154(b) by 0 days.

(21) Appl. No.: 16/609,125

(22) PCT Filed: Apr. 27, 2018

(86) PCT No.: PCT/IN2018/050262
§ 371 (c)(1),
(2) Date: Oct. 28, 2019

(87) PCT Pub. No.: WO2018/198137
PCT Pub. Date: Nov. 1, 2018

(65) Prior Publication Data
US 2020/0203472 A1 Jun. 25, 2020

(30) Foreign Application Priority Data
Apr. 28, 2017 (IN) .............................. 201741015228

(51) Int. Cl.
*H01L 31/0352* (2006.01)
*H01L 29/04* (2006.01)
(Continued)

(52) U.S. Cl.
CPC .............. *H01L 29/04* (2013.01); *B01J 23/08* (2013.01); *H01L 31/0322* (2013.01); *H01L 31/0336* (2013.01); *H01L 31/035218* (2013.01)

(58) Field of Classification Search
CPC .............................................. H01L 31/035218
See application file for complete search history.

(56) References Cited

U.S. PATENT DOCUMENTS

| 6,322,901 B1 | 11/2001 | Bawendi et al. |
| 6,592,842 B2 | 7/2003 | Elder et al. |

(Continued)

FOREIGN PATENT DOCUMENTS

| EP | 1034571 A1 | 9/2000 |
| EP | 1590171 B1 | 6/2011 |

OTHER PUBLICATIONS

Mukherjee, A. "Ultrafast spectroscopic investigation of the artificial photosynthetic activity of CuAlS2/ZnS quantum dots" Nano Select Jan. 12, 2021 pp. 1-9 (Year: 2021).*

(Continued)

*Primary Examiner* — Grant S Withers
(74) *Attorney, Agent, or Firm* — Cozen O'Connor

(57) ABSTRACT

Present subject matter provides a semiconductor nanocrystal comprises a core and a shell. The core is fabricated from a first semiconductor. The shell is fabricated from a second semiconductor. The optical cross section of the semiconductor nanocrystal is in a range of $10^{-17}$ cm$^2$-$10^{-12}$ cm$^2$ in a 2-3 eV region. The core is less than 2 nanometers from an outer surface of the shell in at least one region of the semiconductor nanocrystal. Present subject matter also provides method for preparation of the semiconductor nanocrystals and method for photosynthesis of organic compounds.

9 Claims, 18 Drawing Sheets

(51) Int. Cl.
 *B01J 23/08* (2006.01)
 *H01L 31/032* (2006.01)
 *H01L 31/0336* (2006.01)

(56) References Cited

U.S. PATENT DOCUMENTS

| | | | |
|---|---|---|---|
| 2002/0071970 | A1 | 6/2002 | Elder et al. |
| 2003/0013109 | A1 | 1/2003 | Ballinger et al. |
| 2008/0038558 | A1 | 2/2008 | Landry et al. |
| 2010/0308272 | A1 | 12/2010 | Peng et al. |
| 2011/0012087 | A1 | 1/2011 | Allen et al. |
| 2012/0061627 | A1* | 3/2012 | Reiss .................. C30B 29/60 |
| | | | 252/519.14 |
| 2017/0218264 | A1* | 8/2017 | Klimov ................ C09K 11/883 |

OTHER PUBLICATIONS

McBride J. "Structural Basis for Near Unity Quantum Yield Core/Shell Nanostructures" Nano. Lett. vol. 6, No. 7, published Jun. 9, 2006 pp. 1496-1501 (Year: 2006).*

Zhu, H. "Wavefunction engineering in quantum confined semiconductor nanoheterostructures for efficient charge separation and solar energy conversion" Energy Environ. Sci. 5 published Jul. 24, 2012 pp. 9406-9418 (Year: 2012).*

International Search Report for PCT/IN2018/050262, dated Jul. 24, 2018, 4 pages.

Kisch, H. et al., "Photoreduction of Bicarbonate Catalyzed by Supported Cadmium Sulfide," Photchem. Photobiol. Sci. 2002, 1, 240-245.

Kolny-Olesiak, J. et al., "Synthesis and Application of Colloidal CuInS2 Semiconductor Nanocrystals," ACS Appl. Mater. Interfaces,, 2013, 5, 23, 12221-122237.

Leonard, D. et al., "Photocatalyzed Reduction of Bicarbonate to Formate: Effect of ZnS Crystal Structure and Positive Scavenger," ACS Appl. Mater. Interfaces 2015, 7, 24543-24549.

Speranskaya, E. et al., "Synthesis of hydrophilic CuInS/ZnS Quantum Dots with Different Polymeric Shells and Study of their Cytotoxicity and Hemocompatibility," ACS Appl. Mater. Interfaces 2016, 8, 23 pages including Supporting Materials.

Thuy, N. et al., "Low-cost and Large-scale Synthesis of CuInS2 and CuInS2/ZnS Quantum Dots in Diesel," Optical Materials, vol. 37, 2014, 823-827.

Written Opinion for PCT/IN2018/050262, dated Jul. 24, 2018, 6 pages.

* cited by examiner

* # SEMICONDUCTOR NANOCRYSTALS

TECHNICAL FIELD

The present subject matter relates in general to semiconductor nanocrystals, and in particular to quantum dots fabricated from semiconductors for light harvesting.

BACKGROUND

Semiconductor Nanocrystals (NCs) are semiconductors which have a particle size of a few nanometers. Semiconductor nanocrystals also include quantum dots (QDs). Properties of the NCs can be tuned by varying their size and shape. Typically, NCs are used in optical applications, such as light-emitting devices, lasers, and the like. NCs have also been used in lighting harvesting systems, such as photovoltaic cells and as photo-catalysts.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Figure 1:
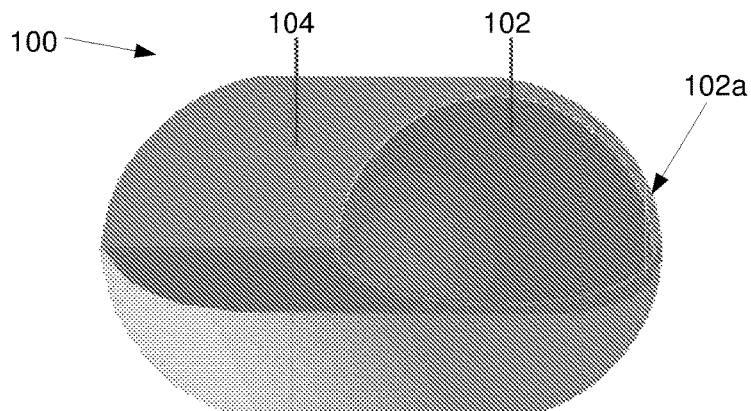
FIG. 1 illustrates an example semiconductor nanocrystal, in accordance with an example implementation of the present subject matter.

The present subject matter provides semiconductor nanocrystals (NCs) for using in light harvesting system and to obtain organic compounds.

Semiconductors NCs have been used in solar light harvesting applications, such as solar cells and photovoltaic cells. Due to small size of NCs, their energies are tunable by changing their shape. Their size and shape in turn define their bandgap. However, conventional semiconductor NC based light harvesting photovoltaic devices exhibit lower efficiencies, typically no more than 10-12%. Efficiencies of nanocrystal photocatalysts are still lower. In contrast, bulk single junction light harvesting devices, such as photovoltaics comprising gallium arsenide, exhibit efficiencies of approximately 30%. However, gallium arsenide photovoltaics are not suitable for terrestrial use due to their prohibitive costs. Most commercially available photovoltaic modules made from silicon, cadmium telluride, and the like, have an efficiency of about 14%. In addition to photovoltaics, light harvesting properties of NCs have also been used for photo-catalysis.

During photo-catalysis, electron hole pairs, i.e. excitons, formed in the NC due to irradiation of light, drive redox reactions in the surrounding liquid. NCs have been used for photo-reduction of carbon dioxide to obtain organic compounds, especially fuels, such as methane, methanol, etc. However, energetic yield of such processes has been too low to be quantified adequately.

The present subject matter provides a semiconductor nanocrystal (NC). The semiconductor nanocrystal comprises a core fabricated from a first semiconductor; and a shell fabricated from a second semiconductor. The optical cross section of the semiconductor nanocrystal is in a range of $10^{-17}$ cm$^2$-$10^{-12}$ cm$^2$ in a 2-3 eV region. In one example, the core is less than 2 nanometers from an outer surface of the shell in at least one region of the semiconductor nanocrystal. In an example, the shell encloses the core asymmetrically.

The present subject matter further provides a method for preparing the semiconductor nanocrystals where the core is a copper aluminum sulfide core and the shell is a zinc sulfide shell. A core anion precursor is contacted with a core cation precursor to obtain the core. The shell is prepared enclosing the core. The shell is prepared by heating the core to a temperature in a range of 215-225° C. and contacting the core with shell precursor to obtain the semiconductor nanocrystal.

The present subject matter further provides a method for photosynthesis of organic compounds, i.e., to produce organic compounds when exposed to light. A plurality of semiconductor nanocrystals is contacted with a dispersion of salts selected from the group consisting of carbonates, bicarbonates, and carboxylates to obtain a first composition. The first composition is irradiated with light to obtain organic compounds. In an example, the salts are contacted with water to obtain the dispersion and the plurality of semiconductor nanocrystals are added to the dispersion. In another example, the plurality of semiconductor nanocrystals is deposited on an inner surface of a vessel to obtain a coated vessel and the dispersion is added to the coated vessel and irradiated with light.

The semiconductor NC of the present subject matter shows absorption of light at energies as low as 1.5 eV, allowing for the absorption of a large amount of sunlight. It also exhibits high photochemical activity in the presence of salts selected from the group consisting of carbonates, bicarbonates, and carboxylates. Using the NC based device, carbon dioxide in the form of sodium bicarbonate was reduced in presence of visible light, without the need of a co-catalyst, promoter, or a sacrificial reagent. Therefore, the NCs perform a reaction analogous to photosynthesis. Using the NCs of the present subject matter a large turnover number in excess of 2 million per NC is observed. Here, turnover number is defined as number of bicarbonate molecules reduced per number of quantum dots. For the formation of sodium formate, a turnover in excess of 70,000 has been determined. In this case, the turnover number is defined as the number of formate molecules produced per NC. A maximum energy conversion efficiency of 20.1% was observed in the NC and the NC based device. A mean efficiency of 17.6% was observed. Energy conversion efficiency, as will be understood, is a fraction of light energy that is converted to chemical energy.

The above and other features, aspects, and advantages of the subject matter will be better explained with regard to the following description and accompanying figures. It should be noted that the description and figures merely illustrate the principles of the present subject matter along with examples described herein, and should not be construed as a limitation to the present subject matter. It is thus understood that various arrangements may be devised that, although not explicitly described or shown herein, embody the principles of the present disclosure. Moreover, all statements herein reciting principles, aspects, and examples thereof, are intended to encompass equivalents thereof. Further, for the sake of simplicity, and without limitation, the same numbers are used throughout the drawings to reference like features and components.

FIG. 1 illustrates an example semiconductor nanocrystal 100, in accordance with an example implementation of the present subject matter. The semiconductor nanocrystal 100 comprises a core 102 fabricated from a first semiconductor. In an implementation, the first semiconductor material is selected from the group consisting of CuAlS$_2$, CdSe, CuGaS$_2$, CuInS$_2$, ZnTe, ZnSe, GaN, AlN, GaP, InP, InN, AlP, AlAs, Copper doped ZnS, Copper doped ZnSe, AgAlS$_2$, CuAlSe$_2$, CuAlTe$_2$, CuGaSe$_2$, CuGaTe$_2$, AgGaS$_2$. ZnS, SiC, CuFeS$_2$, CdS, CdTe, TiO$_2$, ZnO, AgFeS$_2$, AuFeS$_2$, CuFeSe$_2$, CuFeTe$_2$, CuCoS$_2$, CuCoSe$_2$, CuCoTe$_2$, AgCoS$_2$, AgCoSe$_2$, AgCoTe$_2$, CuCrS$_2$, CuCrSe$_2$, CuCrTe$_2$, aluminium gallium and indium ternary compounds, and the like, and alloys thereof.

The semiconductor nanocrystal 100 further comprises a shell 104 fabricated from a second semiconductor. The shell 104 encloses the core 102. In an implementation, the second semiconductor material is selected from the group consisting of ZnS, CuAlS$_2$, CuGaS$_2$, CuInS$_2$, ZnTe, ZnSe, GaN, AlN, GaP, InP, InN, AlP, AlAs, Copper doped ZnS, Copper doped ZnSe, AgAlS, CuAlSe$_2$, CuAlTe$_2$, CuGaSe$_2$, CuGaTe$_2$, AgGaS$_2$, SiC, CuFeS$_2$, CdSe, CdS, CdTe, TiO$_2$, ZnO, AgFeS$_2$, AuFeS$_2$, CuFeSe$_2$, CuFeTe$_2$, CuCoS$_2$, CuCoSe$_2$, CuCoTe$_2$, AgCoS$_2$, AgCoSe$_2$, AgCoTe$_2$, CuCrS$_2$, CuCrSe$_2$, CuCrTe$_2$, aluminium gallium and indium based ternary compounds, and the like, and alloys thereof.

In an implementation, the first and second semiconductor material are selected such that the core band offset is staggered compared to a shell band offset. In an example, the core 102 is a copper aluminum sulfide core and the shell 104 is a zinc sulfide shell. In another example, the core 102 and the shell 104 are selected from a group of semiconductors which have a staggered offset. The shell 104 passivates surface of the core 102 and makes it unreactive. This provides protection against environmental changes and photo-chemical degradation. Control of the size, shape, and composition of both the core 102 and the shell 104 enable the emission wavelength to be tuned over a wider range of wavelengths than is possible with either individual semiconductor.

In an implementation, the NCs have a type II core-and-shell nanostructure. In type II core-and-shell nanostructures, either the valence-band edge or the conduction band edge of the shell material is located in the bandgap of the core. This configuration of the core-and-shell leads to a smaller effective bandgap than that of either one of the constituting core and shell materials. This further helps in manipulating the shell thickness and, thereby, in tuning the emission color towards those spectral ranges that are difficult to attain with bulk material or other types of core-and-shell nanostructures.

In one example, the optical cross section of the semiconductor nanocrystal 100 is in a range of $10^{-17}$ cm$^2$-$10^{-12}$ cm$^2$ in a 2-3 eV region. The core 102 is less than 2 nanometers from an outer surface of the shell 104 in at least one region of the semiconductor nanocrystal. It is to be understood that multiple shell layers can be formed over the core 102 to form the semiconductor nanocrystal 100 of the present subject matter. The core 102 can be enclosed in a single shell layer or a plurality of shell layers. A single shell layer has been used herein for illustration of the working of disclosure and is not intended to be taken restrictively.

In an example, a longest dimension of the semiconductor nanocrystal 100 is in a range of 5 nanometers to 25 nanometers. In another example, the longest dimension of the semiconductor nanocrystal 100 is in a range of 5-7 nm. In another example, the longest dimension of the semiconductor nanocrystal 100 is 6.1±0.4 nm. In an implementation, the shape of the NCs is elongated. In said implementation, the NCs have a mean aspect ratio of 1:1-1:10. In an example, the shell 104 encloses the core 102 non-uniformly. In said example, a first portion 102a of the core 102 is closer to an outer surface of the shell 104. Non-uniform enclosing of the core 102 by the shell 104 allows for enhanced absorption of light while allowing free movement of holes and electrons to and from the core 102 and the shell 104 to the surface. This provides better photo-redox capability as both charges have surface access. In another implementation, the shell 104 may enclose the core 102 uniformly. Uniformly enclosing the core 102 may, however, lead to either a reduced optical cross-section of the semiconductor nanocrystal 100 in cases where the shell 104 is thin or reduced photo-redox ability when the shell 104 is thick. Further, when the shell 104 is thick there is poor surface access of charge carriers that resides in the core 102 which, therefore, reduces photo-redox ability. It is to be understood that shell thickness can be varied to obtain required optoelectronic property and photocatalytic property.

Figure 2:
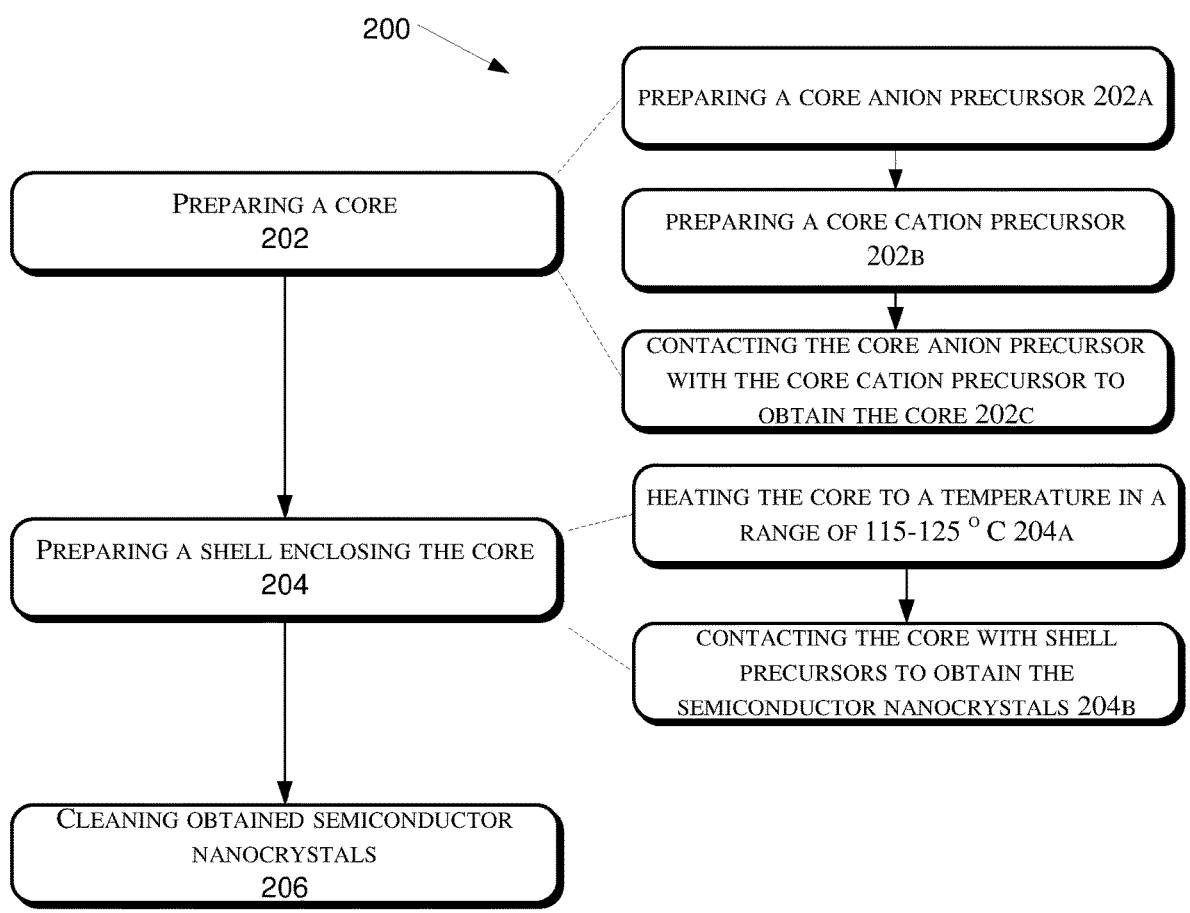
FIG. 2 illustrates a method for preparing a semiconductor nanocrystal, in accordance with an example implementation of the present subject matter.

FIG. 2 illustrates a method 200 for preparing the semiconductor nanocrystal, in accordance with an implementation of the present subject matter. The order in which the method 200 is described is not intended to be construed as a limitation, and any number of the described method blocks can be combined in any order to implement method 200 or an alternative method. For discussion, the method 200 is described with reference to the implementations illustrated in FIG. 1.

At block 202, a core is prepared. In an example, the core is core 102 as illustrated in FIG. 1. The core 102 may be a copper aluminum sulfide core. Steps for preparation of the core are further illustrated in blocks 202a-202c. At block 202a, to prepare the core, a core anion precursor is prepared. Further, at block 202b, a core cation precursor is prepared. At block 202c, the core anion precursor is contacted with the core cation precursor to obtain the core. In an example, the core cation precursor may be contacted with an organic thiol prior to contacting with the core anion precursor.

On preparing the core, at block 204, a shell enclosing the core is prepared. In an example, the shell is the shell 104 as shown in FIG. 1. In an example, the shell may be made of zinc sulfide. Steps for preparation of the shell are further illustrated in blocks 204a-204b. To prepare the shell enclosing the core, at block 204a, the core is heated to a temperature of 160-285° C. At block 204b, the core is contacted with shell precursors to obtain the shell enclosing the core, and thereby forming the semiconductor nanocrystals. In an example, the shell precursors comprise zinc oleate and sulfur dissolved in octadecene.

In an example, the semiconductor nanocrystal obtained is the semiconductor nanocrystal 100 as shown in FIG. 1 where the shell non-uniformly encloses the core and where the core is less than 2 nanometers from an outer surface of the shell in at least one region. In one example, the optical cross section of the semiconductor nanocrystal thus formed is in a range of $10^{-17}$ $cm^2$-$10^{-12}$ $cm^2$ in a 2-3 eV region. As will be understood, optical cross section ($\sigma$ (hv)) expresses strength of interaction of electromagnetic radiations with electronic energy level systems of the semiconductor nanocrystal. On obtaining the semiconductor nanocrystal, at block 206, the obtained semiconductor nanocrystals are cleaned. It is to be understood that the semiconductor nanocrystals may be subjected to further processing as well.

In an example, the core is fabricated from copper aluminum sulfide. In said example, the core anion precursor is prepared by contacting sulfur with a mixture of oleylamine and octadecene in an inert atmosphere at a temperature range of 25° C.-300° C. for a time period of 25-35 minutes to obtain the core anion precursor. The core cation precursor is prepared by contacting a copper salt, such as copper chloride, and an aluminium salt, such as aluminium acetylacetone, with a liquid medium comprising an organic acid in an inert atmosphere at 85-285° C. for a time period of 10-20 minutes to obtain the core cation precursor. The core cation precursor is contacted with an organic thiol, such as dodecanethiol, to obtain a first mixture. The core anion precursor is contacted with the first mixture at a temperature range of 160-285° C. at a rate of 0.2-0.3 mL/min to obtain the copper aluminium sulfide core.

In an example, the shell is fabricated from zinc sulfide. In said example, shell precursor comprises zinc oleate dissolved in a mixture of sulfur in octadecene. The shell precursor is slowly injected onto the core to make the shell growth of ZnS on the top of $CuAlS_2$.

The semiconductor nanocrystal absorbs light with wavelength as long as 800 nm and employ the absorbed light to reduce carbon dioxide. As will be discussed later, the semiconductor nanocrystals reduce carbon dioxide in the form of bicarbonates in inorganics into organic compounds, such as formates, acetates, and methanol. In other example, the NCs may reduce carboxylates to organic compounds, such as methanol, butanol, and the like. The NCs, therefore, perform an analog of photosynthesis.

Figure 3:
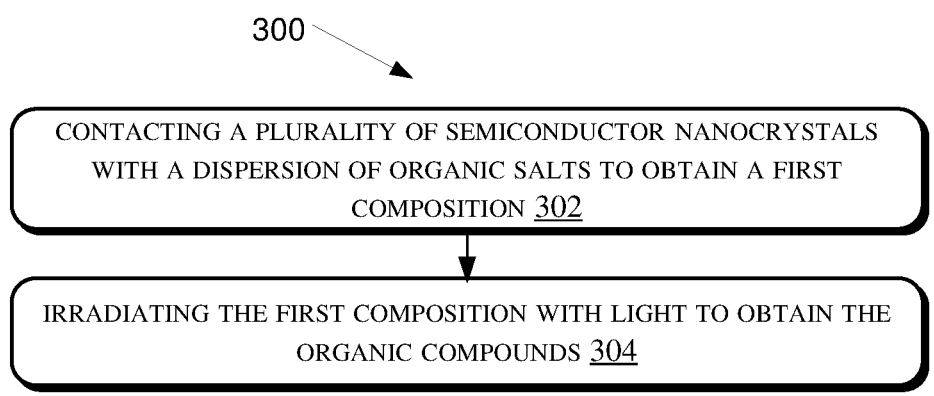
FIG. 3 illustrates a method for photosynthesis of organic compounds, in accordance with an implementation of the present subject matter.

FIG. 3 illustrates a method 300 for photosynthesis of organic compounds, in accordance with an implementation of the present subject matter. At block 302, a plurality of semiconductor nanocrystals is contacted with a dispersion of salts selected from the group consisting of carbonates, bicarbonates, and carboxylates to obtain a first composition. In an example, the carboxylates may be formates, acetates, and combinations thereof. In an example, the semiconductor nanocrystals are semiconductor nanocrystals 100 as shown in FIG. 1 with the optical cross section of the semiconductor nanocrystal in a range of $10^{-17}$ $cm^2$-$10^{-12}$ $cm^2$ in a 2-3 eV region, and where the core 102 is less than 2 nanometers from an outer surface of the shell 104 in at least one region.

In an example, to contact the plurality of semiconductor nanocrystals with the dispersion, the salts are contacted with water to obtain the dispersion and the plurality of semiconductor nanocrystals is added to the dispersion. In an example, concentration of salts in the dispersion is in a range of 1 micromolar to 10 molars. In an example, the dispersion comprises a first fraction of salts soluble in water and a second fraction of salts insoluble in water. The second fraction may act as a buffer. In an example, the second fraction may comprise carbon comprising salts different from that of the first fraction. In said example, the insoluble salt may be zinc carbonate, calcium carbonate, magnesium carbonate, and the like.

In another example, to contact the plurality of semiconductor nanocrystals with the dispersion, the plurality of semiconductor nanocrystals is deposited on an inner surface of a vessel to obtain a coated vessel. The dispersion is then added to the coated vessel. On contacting the plurality of semiconductor nanocrystals with the dispersion, at block 304, the first composition is irradiated with light to obtain the organic compounds. Products of irradiating the first composition are organic compounds such as formate, acetate, methanol, and butanol.

In an example, the semiconductor nanocrystals may be provided as a plurality of layers on an inert substrate prior to contacting the plurality of semiconductor nanocrystals with the dispersion. In an example, the inert substrate comprises a granular material with grain size 50 nm to 1 cm. The inert substrate can be selected from the group consisting of glass, silicate glass, non-silicate glass, silica, activated silica, zeolite, sapphire, alumina, calcite, calcium fluoride, magnesium fluoride, barium fluoride, mica, teflon, anodized aluminum, ZnO, and $TiO_2$. The NCs are deposited on the inert substrate to obtain an NC based device. Deposition of NCs can be done by deposition techniques such as drop casting or spin coating from colloidal dispersions and the like. The inert substrate provides mechanical support to the NCs while not affecting its properties.

The present subject matter will now be illustrated with working examples, which are intended to illustrate the working of disclosure and not intended to be taken restrictively to imply any limitations on the scope of the present disclosure. Unless defined otherwise, all technical and scientific terms used herein have the same meaning as commonly understood to one of ordinary skill in the art to which this disclosure belongs. It is to be understood that this disclosure is not limited to the particular methods and experimental conditions described, as such methods and conditions may vary depending on the process and inputs used as will be easily understood by a person skilled in the art.

EXAMPLES

Example 1: Preparation of NCs

In this example, NCs having varying semiconductors were prepared. copper(I) chloride anhydrous (CuCl, 97%), aluminium acetylacetonate [Al(acac)3, 98%], zinc acetate [$Zn(CH_3COO)_2$], cadmium acetate [$Cd(CH_3COO)_2$], myristic acid (99.9%) sulphur (S). 1-Octadecene (ODE, technical grade, 90%), Oleic acid (OA, 99%), Oleylamine (technical grade, 70%), 1-dodecanethiol (DDT) were purchased from Sigma-Aldrich. All the chemicals were used without any purification.

Example 1.1: Preparation of $CuAlS_2$ NCs $CuAlS_2$ (NCs) were prepared in two steps. First step consisted of preparation of anion precursor (preparation of sulfur in oleylamine). In the first step sulfur powder (3.2 mg, 0.1 mmol) was added to a 20 mL three-necked flask containing 2.5 mL oleylamine and 2 mL of 1-octadecene. This flask was held at 25-300° C. under argon for 30 min. It formed an orange color clear solution with complete dissolution of sulfur.

In the second step, metal cation precursors, namely copper chloride (9.9 mg, 0.1 mmol) and aluminium acetylacetone (48.6 mg, 0.15 mmol), were added to a 50 mL three-necked flask (Flask 2) containing 2 mL ODE as solvent and 2 mL oleic acid as ligand. The three-necked flask was heated to 80° C. under vacuum for 5 min to get rid of any water if present. The metal cation precursors were heated under argon atmosphere at 120° C. for 15 min to obtain metal oleates. Copper formed a blue color solution. This was followed by dissolution of aluminium which formed a white colored solution.

At 150° C., 2.5 mL of 1-dodecanethiol (DDT) was added to the white colored solution comprising the dissolved copper and aluminium. Addition of DDT causes the white colored solution to turn into a colorless solution. The temperature was then raised to 180° C. to initiate the nucleation of $CuAlS_2$ NCs. Sulfur in oleylamine was introduced drop wise (0.5 ml for 2 minute) to this solution to avoid nucleation of pure $Cu_2S$. The colorless solution becomes bright pale yellow rapidly upon the addition of the sulfur precursor. These color changes are associated with the appearance of $CuAlS_2$ NCs.

Example 1.2: Preparation of $CuAlS_2$/ZnS NCs

In this example, $CuAlS_2$/ZnS NCs were prepared. The zinc shell precursor, zinc oleate, was separately prepared by heating 110 mg of zinc acetate in oleic acid (5 mL) and octadecene (7 mL) at 250° C. for 10 min under argon. The resultant colorless solution was then degassed under vacuum for 5 min at 180° C.

In a 50 mL three necked flask, 10 mL of freshly prepared $CuAlS_2$ NCs was taken and was heated to 120° C. under argon atmosphere. At this temperature 0.5 ml zinc oleate was added initially to stop the growth of any other by-product at a high temperature. The temperature of the reaction was then raised to 200° C. Zinc oleate (0.1 ml per 2 min) and sulfur in ODE (0.1 ml per 2 min) were slowly injected to make the shell growth of ZnS on the top of $CuAlS_2$. It was observed that addition of Zinc oleate to the solution caused color changes from deep yellow to orange red. Change of color indicates growth of the ZnS shell around $CuAlS_2$ shell.

The NCs were cleaned after synthesis to remove solvent, excess ligand and unreacted precursors for further analysis and characterization. The cleaning was done in three steps. In the first step, 5 mL of methanol was added to 5 mL NCs solution. It was heated with a heat gun and the mixture was centrifuged for 2 min at 1000 Relative Centrifugal Field (RCF). Same procedure was repeated two times. In the second step, 5 mL of ethanol and 0.5 mL of methanol were added to the mixture and centrifuged for 1 min at 1000 RCF. Finally, the supernatant was removed and NCs were found to be precipitated on the walls of the reaction tube. Spectroscopic data were collected by suspending cleaned NCs in n-hexane (spectroscopic grade).

Example 2: Characterization OF NCs

Example 2.1: X-ray Diffraction Study

In this example, the NCs were characterized by using techniques, such as X-Ray Diffraction (XRD). Films for XRD analysis were prepared by suspending cleaned NCs in Hexane solutions, and then drop casting on a glass substrate. A 0.154 nm X-ray source was used to collect all data.

Figure 4:
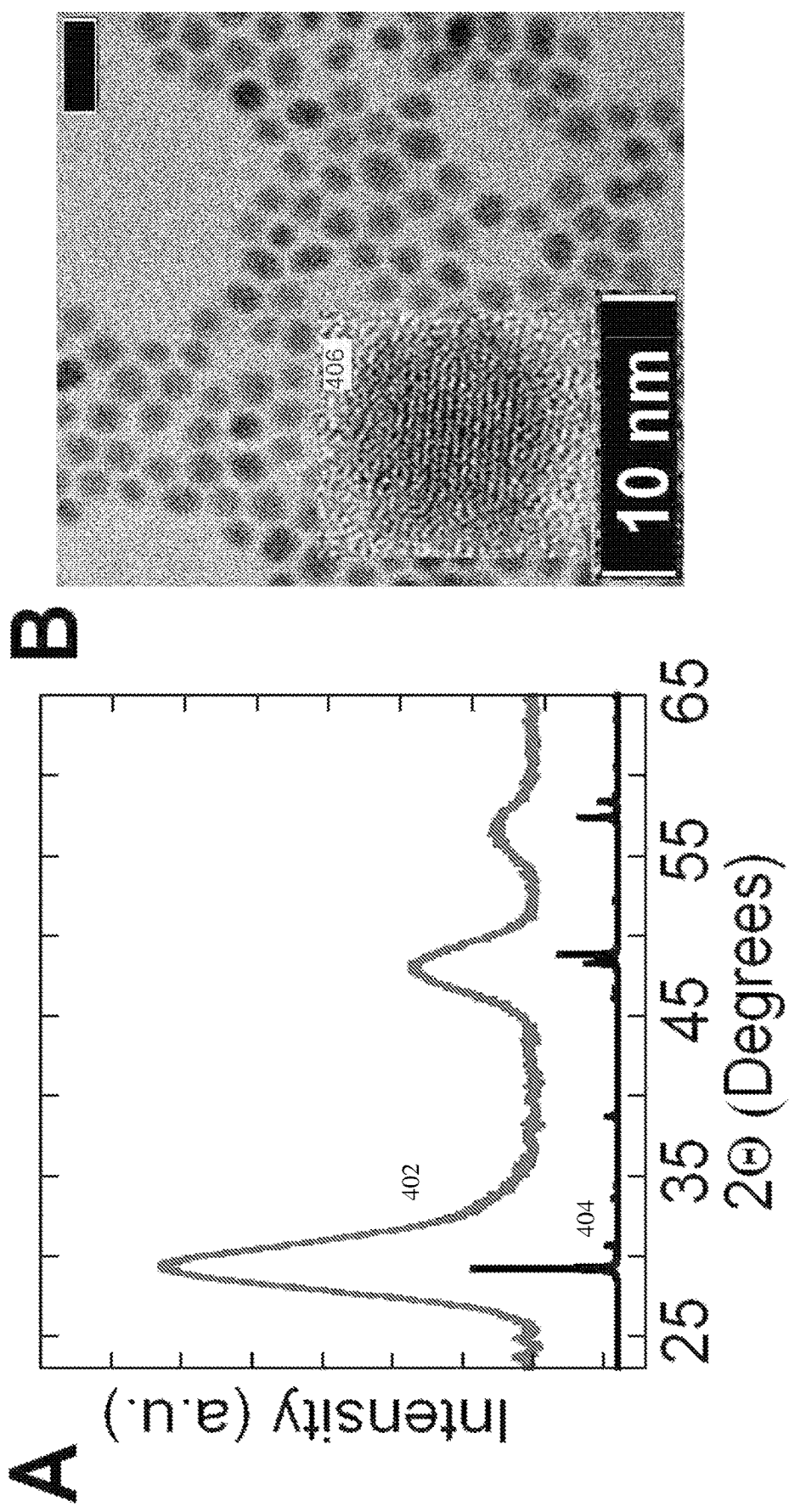
FIG. 4 depicts structural characteristics of $CuAlS_2$ Nanocrystals (NCs), in accordance with an implementation of the present subject matter.

Consistent with their wide band gap of 3.35 eV, $CuAlS_2$ NCs did not show optical absorption in the visible spectrum. The typical X-ray diffraction (XRD) pattern of $CuAlS_2$ particles is shown in FIG. 4A (line 402). The observed reflections are consistent with a tetragonal chalcopyrite structure (line 404).

Example 2.2: Transmission Electron Microscopy Study

Transmission Electron Microscopy (TEM) grid was prepared with ultra clean sample in hexane solution. High Resolution-TEM (HR-TEM) images were obtained on a JEOL JEM-2100 transmission electron microscope (200 kV). STEM was performed in a TITAN TEM operating at 200 kV. STEM-EDX elemental mapping was also performed using the same instrument.

The structural homogeneity at a single particle level was confirmed using transmission electron microscopy (TEM). FIG. 4B shows a TEM image of $CuAlS_2$ NCs. The NCs exhibit a mean size of 6.1±0.4 nm High Resolution TEM (HRTEM) images exemplified in the inset 406 confirm the particle structure.

Figure 5B:
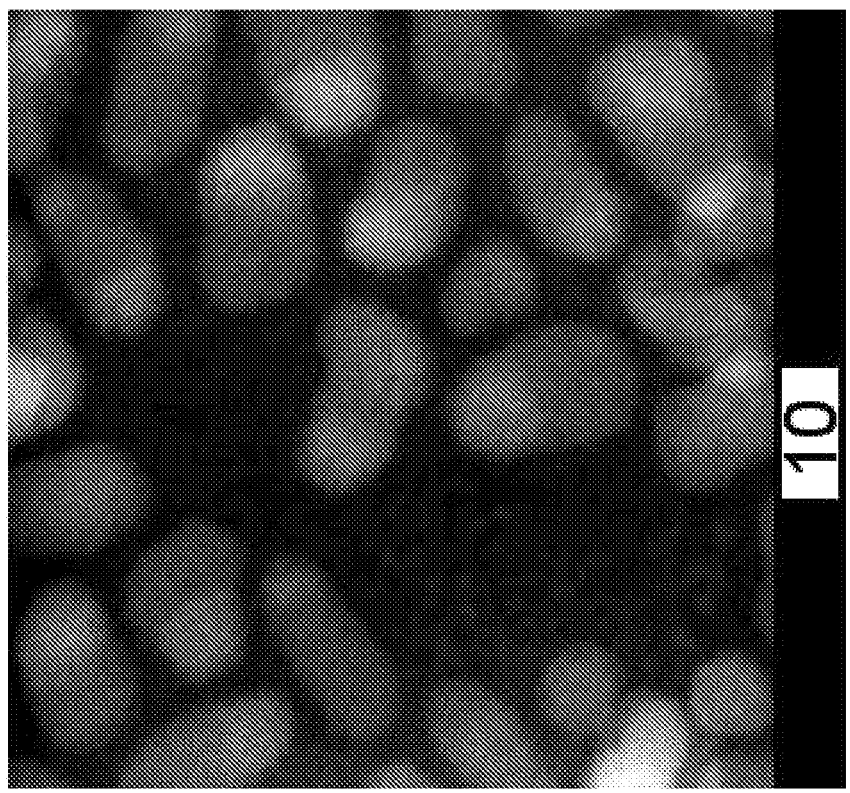
FIG. 5b depicts Scanning Transmission Electron Microscopy (STEM) image of $CuAlS_2$/ZnS NCs, in accordance with an implementation of the present subject matter.
Figure 5A:
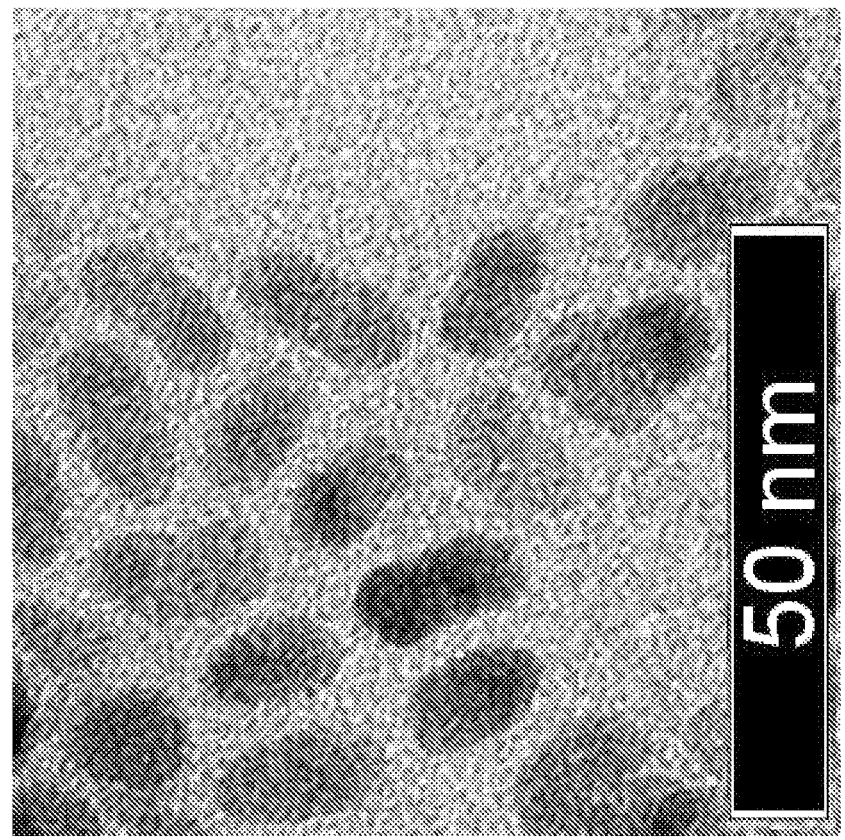
FIG. 5a depicts Transmission Electron Microscopy (TEM) image of $CuAlS_2$/ZnS NCs, in accordance with an implementation of the present subject matter.

FIG. 5a shows a low resolution TEM image of $CuAlS_2$/ZnS NCs. $CuAlS_2$/ZnS NCs exhibited a pronounced tendency to form elongated particles with a mean aspect ratio of 1:2.2.

The structural origins of this elongation were explained by Scanning Transmission Electron Microscopy (STEM) images that show a phase contrast within NCs. FIG. 5b depict the TEM and STEM images respectively, in accordance with an implementation of the present subject matter. STEM images showed the existence of distinct regions of ZnS and $CuAlS_2$, within each NC as illustrated in FIG. 5b.

Example 2.3: Inductively Coupled Plasma Spectroscopy

The absorption cross-section of the material was measured by first dissolving samples comprising the NCs in hexane to take absorption spectra. The solvent was then evaporated, and the NC residue was treated with concentrated nitric acid. The resultant solution was diluted to 25 mL with water. Composition was then determined using Inductively Coupled Plasma Spectroscopy (ICP-OES). The particle size distributions were estimated from TEM images. Bulk density of pure copper aluminium sulfide and zinc sulfide were 3.47 g/cc and 4.09 g/cc. The extinction coefficient was assumed to be identical to the optical absorption as is standard practice for semiconductor particles <20 nm.

Example 2.4: High Annular Aperture Dark Field Imaging Study

Figure 5F:
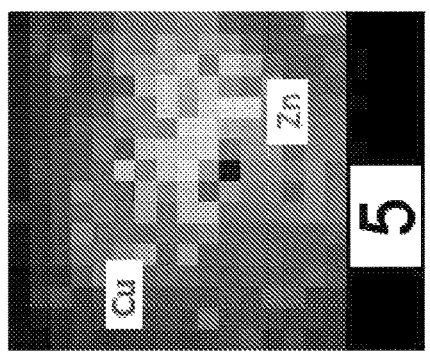
FIGS. 5c-5f depict High-Angle Annular Dark-Field-STEM (HAADF-STEM) image with elemental mapping of $CuAlS_2$/ZnS NCs, in accordance with an implementation of the present subject matter.
Figure 5E:
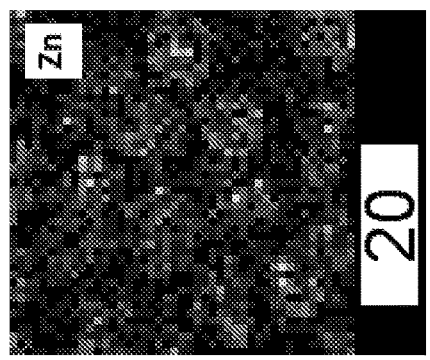
Figure 5D:
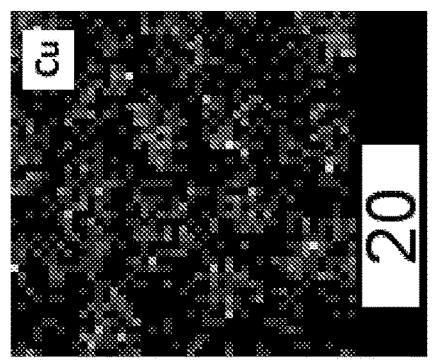
Figure 5C:
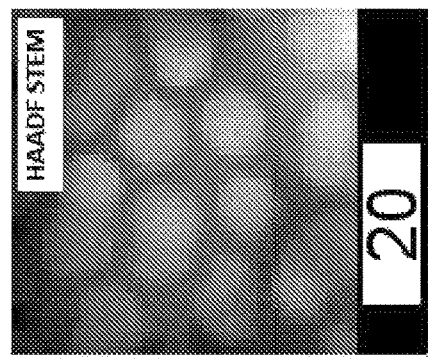
Figure 5H:
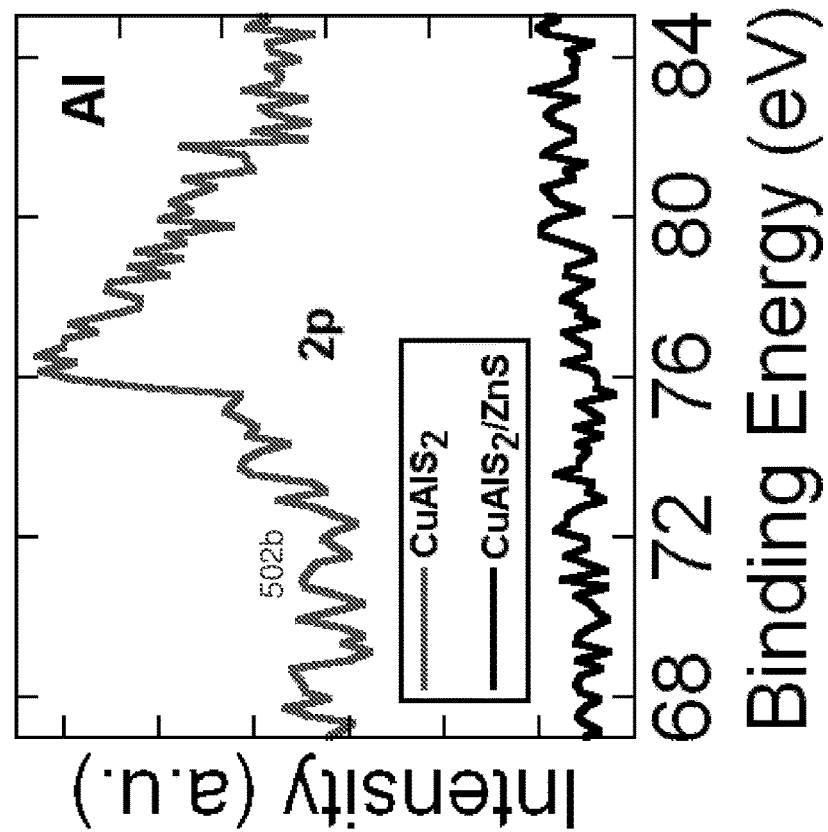
FIGS. 5g-5j depict X-Ray Photoelectron Spectroscopy (XPS) spectra of $CuAlS_2$/ZnS NCs, in accordance with an implementation of the present subject matter.

High Annular Aperture Dark Field (HAADF) imaging of the NCs was conducted. FIGS. 5c-5f show the presence of Zn and Cu containing regions on all NCs. FIG. 5c depicts HAADF-STEM mapping of $CuAlS_2$/ZnS NCs, FIG. 5d depicts elemental mapping showing Cu distribution. FIG. 5e depicts elemental mapping showing Zn distribution. FIG. 5f depicts reconstructed image showing abundances of copper and zinc distributed across a single NC. The asymmetric distribution of these phases on each NC is illustrated in FIG. 5f. FIG. 5f depicts a HAADF image of a single NC overlaid with the elemental distributions of Zn and Cu. It can also be observed that high contrast regions in dark field images correspond to ZnS, while lower contrast regions correspond to $CuAlS_2$, consistent with the lower electron density of the latter.

Example 2.5: X-Ray Photoelectron Spectroscopy Analysis

In order to develop a more comprehensive understanding of surface structure of these NCs, X-ray Photoelectron Spectroscopy (XPS) analysis was conducted. To prepare the NCs for XPS analysis, a substrate was cleaned with 1-propanol at 50° C. thoroughly 3 times. Next, the substrate cleaned above was again cleaned with acetone. Then purified NCs were drop casted on to the substrate. XPS spectra were measured by Kratos Axis Ultra Photo Electron Spectroscopy system. Effective beam area was 20 microns. Results of XPS analysis is as illustrated in FIG. 5g-5j, in accordance with an implementation of the present subject matter.

Figure 5G:
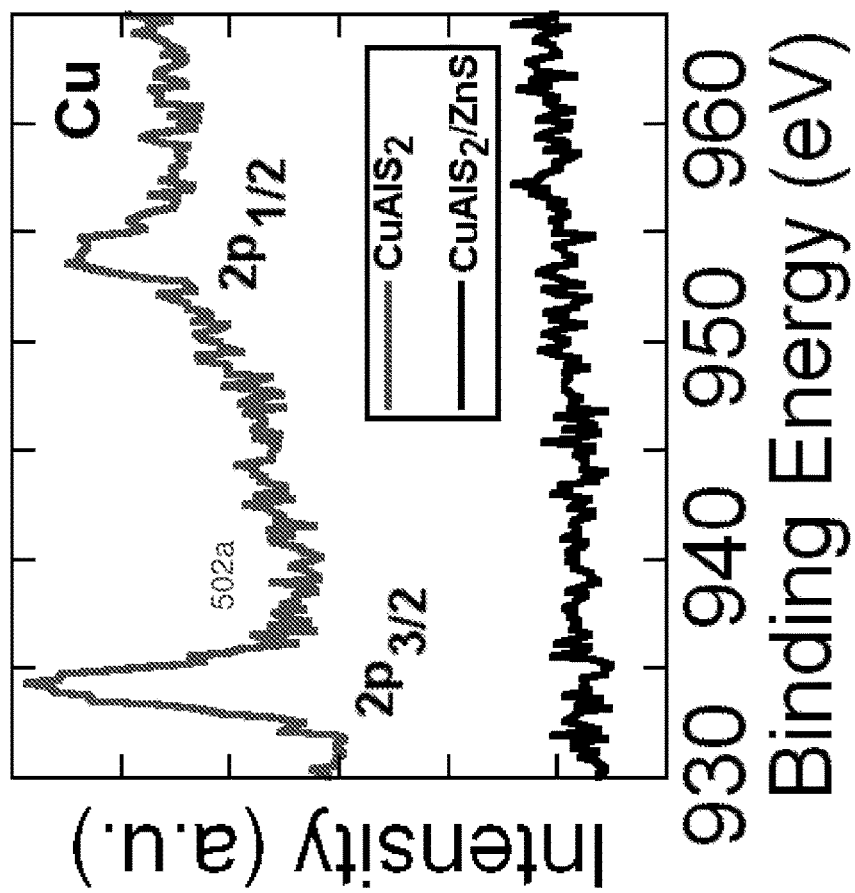
Figure 5J:
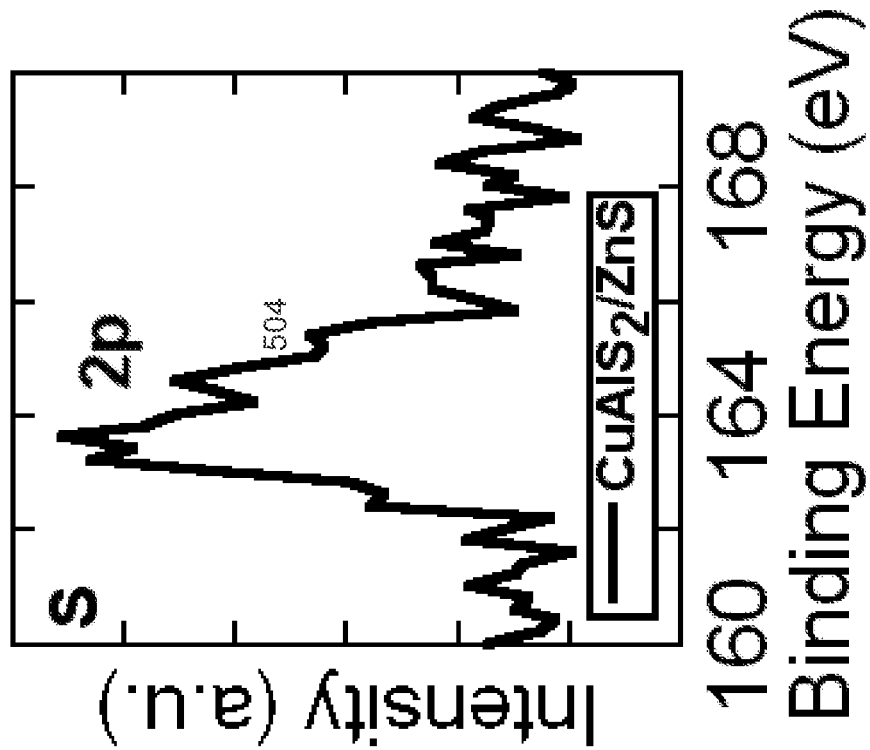
Figure 5I:
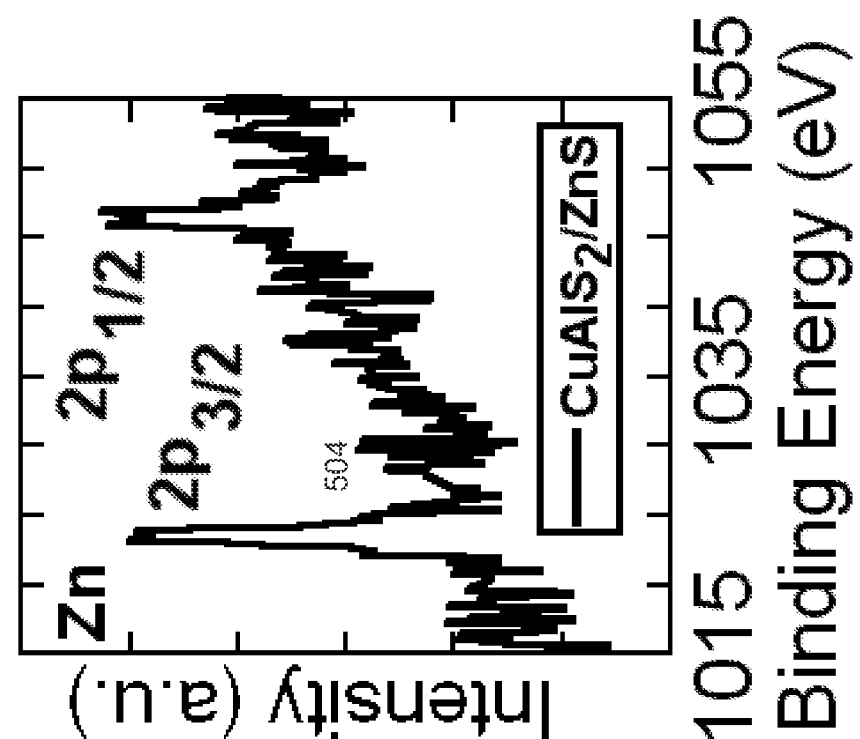

From XPS analysis, it was observed that the surfaces of as-prepared $CuAlS_2$ NCs were found to contain copper, aluminium and sulphur atoms consistent with their composition. This is shown in FIG. 5g for copper and 5h for aluminium (lines 502a and 502b). ZnS growth however removed the signatures corresponding to aluminium and copper as shown in FIG. 5i and 5j (line 504). The photoelectron spectra of $CuAlS_2$/ZnS NCs further showed the presence of zinc and sulphur on the surface.

Collectively this data implied a continuous ZnS surface coating (FIG. 5i and 5j). It was thus inferred that $CuAlS_2$/ZnS NCs may be described as asymmetric core/shell materials where the $CuAlS_2$ core is completely embedded in a non-uniform ZnS coating. The final inferred structure of $CuAlS_2$/ZnS NCs is summarized in the schematic shown in FIG. 1 that shows the complete coverage of a spherical $CuAlS_2$ core by an asymmetric ZnS shell. The causes of asymmetric ZnS growth can be ascribed to the different crystal types of the two semiconductors, i.e., $CuAlS_2$ and ZnS.

Figure 5K:
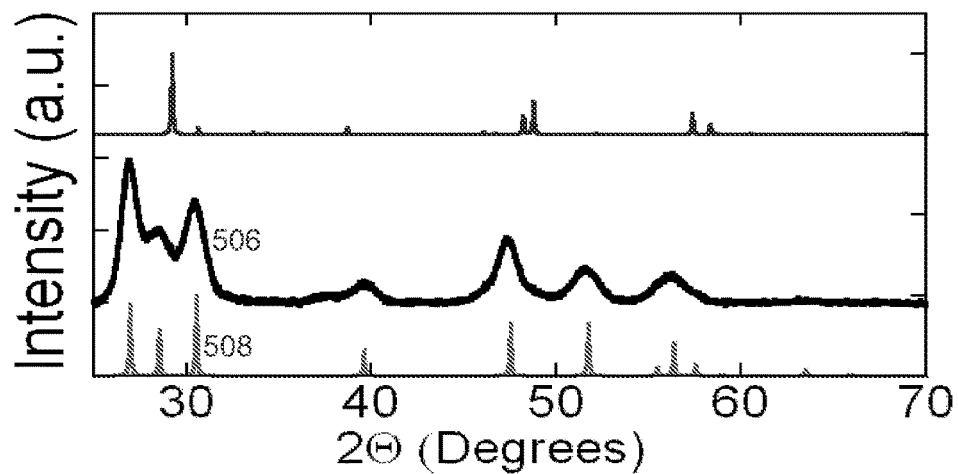
FIG. 5k depicts results of X-ray diffraction (XRD) study of $CuAlS_2$/ZnS NCs, in accordance with an implementation of the present subject matter.
Figure 5L:
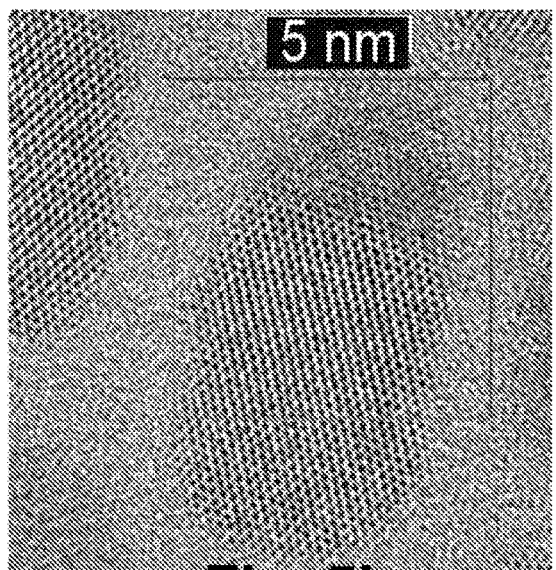
FIG. 5l depicts High Resolution-TEM (HRTEM) image of $CuAlS_2$/ZnS NCs, in accordance with an implementation of the present subject matter.
Figure 5M:
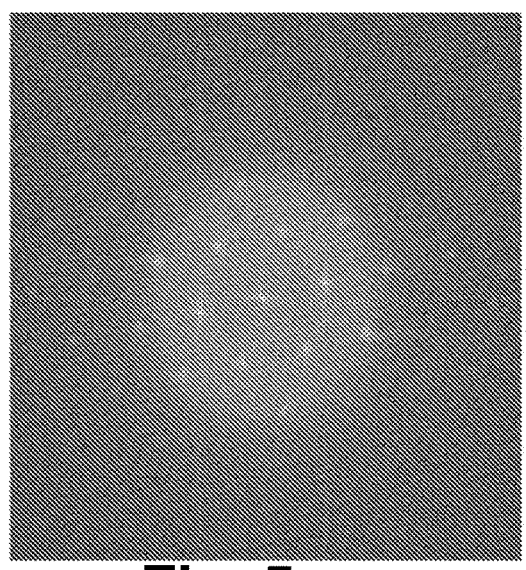
FIG. 5m depicts Fourier Transform showing coincidence of spots corresponding to ZnS and $CuAlS_2$ planes, in accordance with an implementation of the present subject matter.

It was also noted that regardless of the tetragonal structure of $CuAlS_2$ NCs, ensemble level XRD (FIG. 5k, line 506) shows the presence of reflections corresponding to the hexagonal variant of ZnS (FIG. 5k, line 508) in $CuAlS_2$/ZnS NCs. The reconciliation of the existence of two different lattice structures in the same NC can be made by HRTEM imaging of the interface regions (FIGS. 5l and 5m). The [1 0 0] plane of ZnS had an interplanar separation identical to the interplanar separation of [1 1 2] planes of $CuAlS_2$ (0.32 nm). The epitaxial growth of ZnS on $CuAlS_2$ can thus occur by continuity of [1 0 0] and [1 1 2] planes at the semiconductor interface.

This is highlighted in the Fourier transform image, as shown in FIG. 5m, which shows a well-defined alignment of planes of ZnS and $CuAlS_2$ across the entire structure. The qualitative chemical properties of these NCs e.g. their improved stability over pure $CuAlS_2$ NCs are also consistent with the structure inferred from the discussion above.

Example 3: Optical Properties of Core-Shell Configuration NCs

Figure 6A:
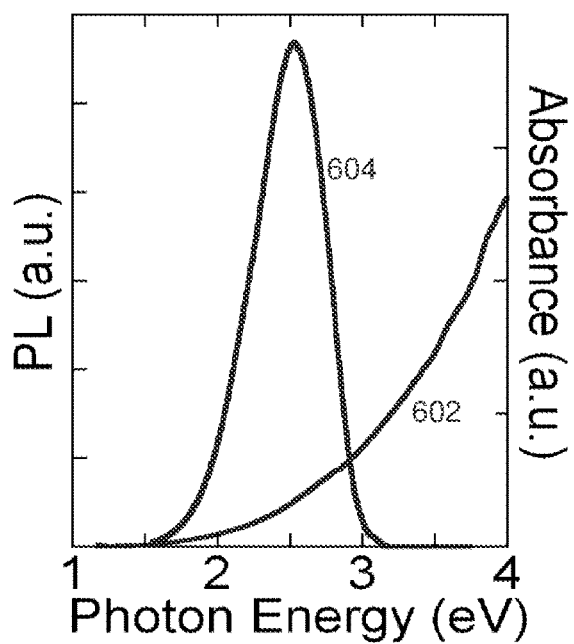
FIGS. 6a-6f depict optical properties of $CuAlS_2$/ZnS NCs, in accordance with an implementation of the present subject matter.
Figure 6B:
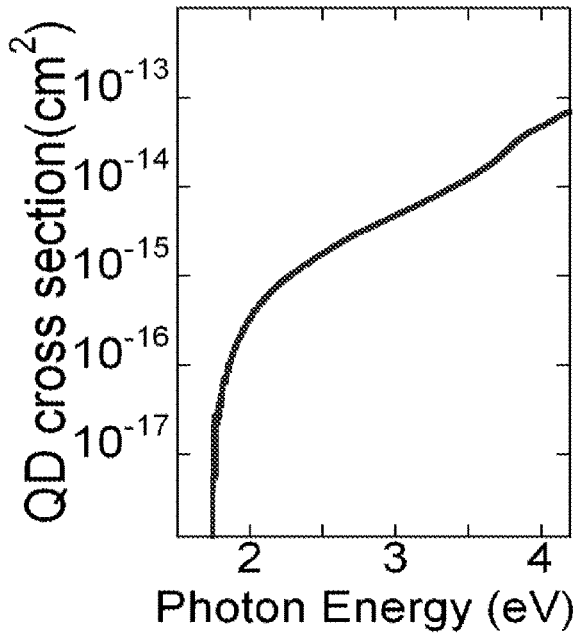
Figure 6C:
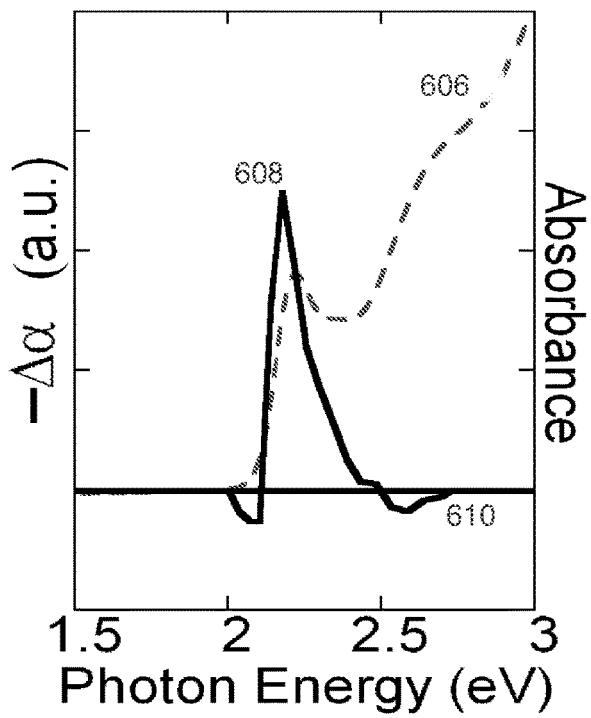
Figure 6D:
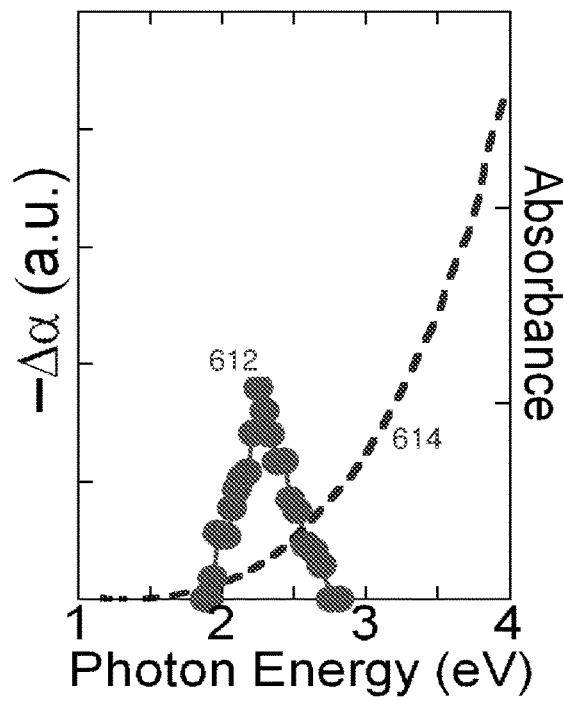
Figure 6F:
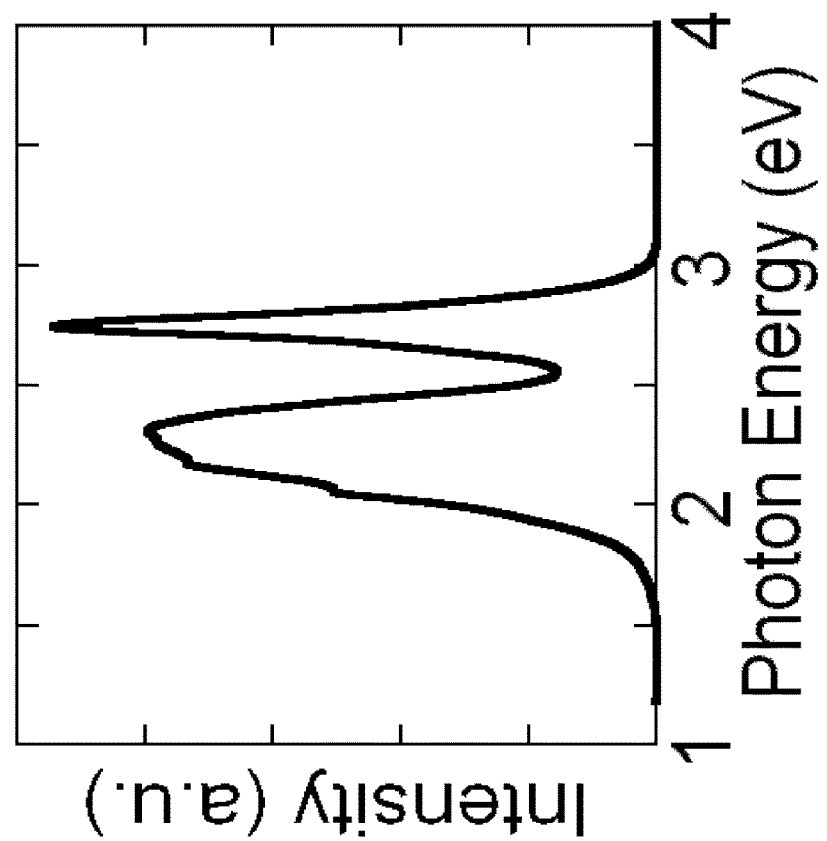
Figure 6E:
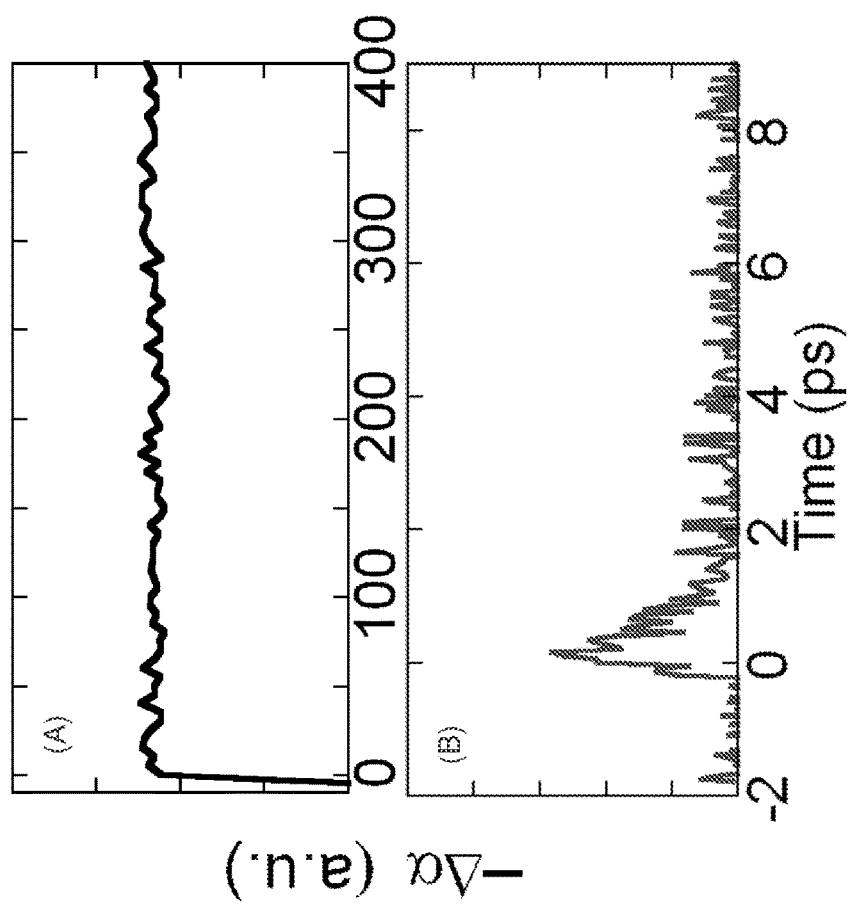

Optical properties of the NCs were studied in this example. FIG. 6a illustrates absorbance line 602 and luminescence line 604 of $CuAlS_2$/ZnS NCs. FIG. 6b illustrates optical cross section of a $CuAlS_2$/ZnS NCs. FIG. 6c illustrates absorbance (line 606) and bleach (line 608) of a sample of CdSe/ZnS. The horizontal line 610 corresponds to the zero of the y axis. Bleach feature recorded 6 ps after initial photoexcitation and represents a cooled 1S exciton. FIG. 6d illustrates band edge bleach feature observed in the case of $CuAlS_2$/ZnS NCs (dots 612) and absorbance (line 614). Bleach feature has been recorded immediately after photoexcitation. FIG. 6e(A) illustrates bleach dynamics in CdSe/ZnS NCs in the single exciton regime. Bleach is stable over the 400 ps duration of the experiment. FIG. 6e(B) illustrates transient bleach of $CuAlS_2/ZnS$ decays with a lifetime of 550 fs.

Example 4: Bicarbonate Reduction

Example 4.1: Reaction Condition 1

The ability of the NCs to reduce carbon dioxide in the form of bicarbonates was studied in this example. A reactor was shaped as a cylinder of inner diameter 2.2 cm taken and the reactor was filed with 56 mg of $CuAlS_2/ZnS$ NCs deposited onto ~1 mm sized glass particles. The glass particles were filled up a height of ~1.5 cm from the reactor base. The reactor was loaded with 0.8 ml of a solution containing 87 mg of $NaHCO_3$, equivalent to ~23 ml of pure gaseous $CO_2$ at standard temperature and pressure. The reactor top was covered with a quartz lid. This assembly was irradiated with AM1.5 sunlight derived from a solar simulator from the top lid.

Example 4.1.1: Spectral Study of Products Obtained Using Reaction Condition 1

Figure 8:
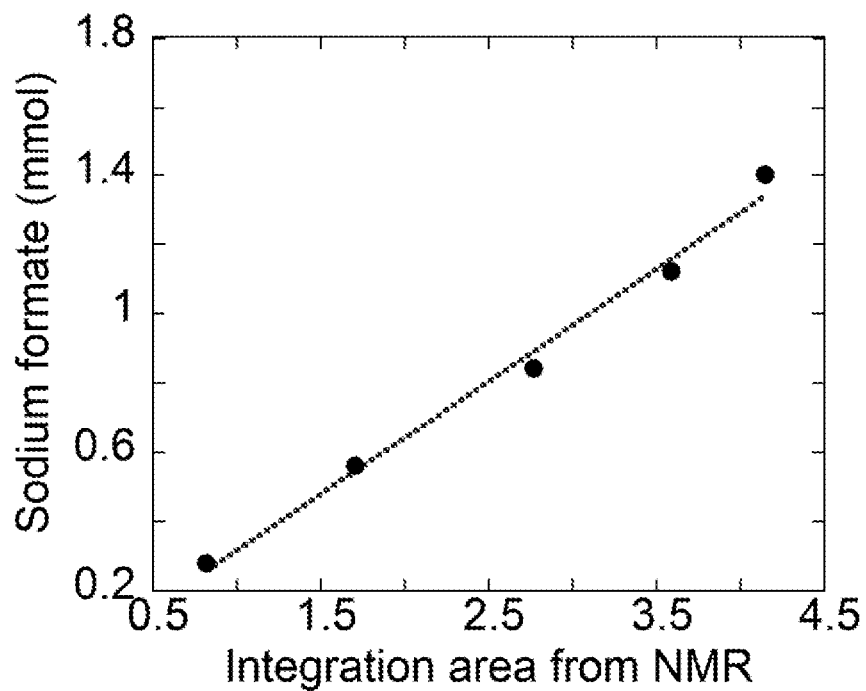
FIG. 8 depicts calibration curve to determine the unknown concentration of sodium formate with respect to $^1H$ NMR integration area with DMSO as an internal standard, in accordance with an implementation of the present subject matter.

After 30 minutes of light exposure, the amount of $HCOO^-$ was determined using $^1H$ NMR spectroscopy with an internal standard (Dimethylsulfoxide, DMSO). To do this, the products were separated from the NCs by decantation, and the water was removed by evaporation. The solid residue obtained was then redissolved in $D_2O$ followed by addition of DMSO. The areas under the proton signals were determined by integration. These were converted into moles by using a calibration curve constructed out of known amounts of both reagents (FIG. 8).

Figure 7:
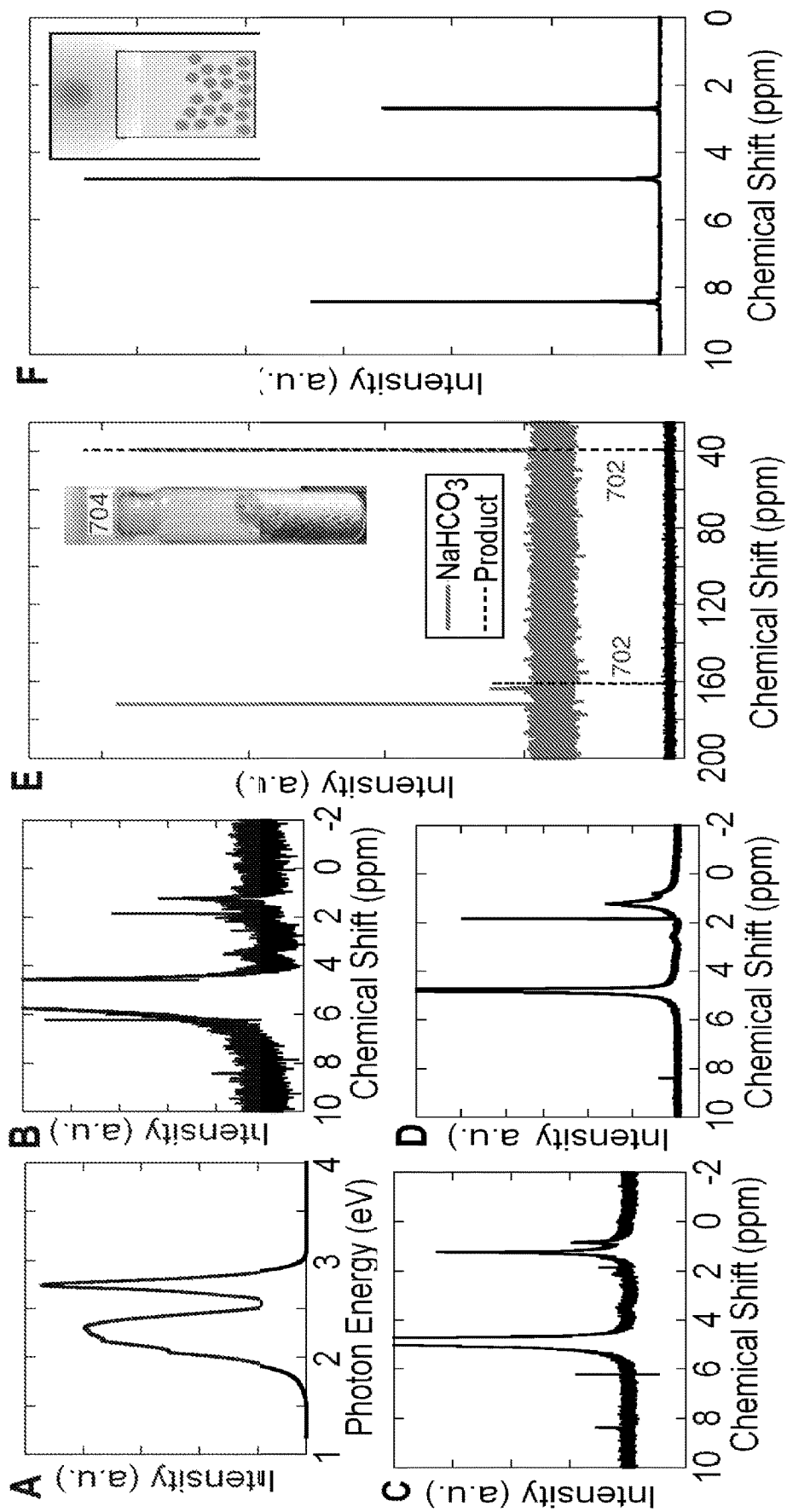
FIGS. 7A-F depict results of bicarbonate reduction studies, in accordance with an implementation of the present subject matter.

FIG. 7a illustrates spectrum of LED lamp used to generate data shown in FIGS. 7b-7d. FIGS. 7b-7d depict $^1H$ NMR spectra taken after 8, 14 and 26 hours of reaction.

Example 4.2: $^{13}C$ NMR Spectral Study

In this example, spectral study of product using $^{13}C$ NMR was conducted. A reactor was shaped as a cylinder of inner diameter 2.2 cm taken and the reactor was filed with 100 mg of $CuAlS_2/ZnS$ NCs deposited onto ~1 mm sized glass particles. The glass particles were filled up a height of ~1.5 cm from the reactor base. The reactor was loaded with a 15-ml saturated solution containing 2 g of $NaHCO_3$. The reactor top was covered with a quartz lid. This assembly was irradiated with AM1.5 sunlight derived from a solar simulator from the top lid.

FIG. 7e depicts $^{13}C$ NMR of the products of a 46-hour bicarbonate reduction reaction with the large excess of sodium bicarbonate. The spectrum of pure sodium bicarbonate is shown by the line 702. The peak at 40 ppm corresponds to DMSO that is employed to calibrate the NMR spectrum. A peak corresponding to formate (173 ppm), a reaction intermediate (163 ppm) were observed. No presence of sodium bicarbonate or sodium carbonate are detected in the $^{13}C$ NMR spectrum. Inset 704 depicts 1.2 g of products isolated by evaporating the solvent.

Example 4.3: Calculation OF Efficiency

In the example shown in FIG. 7f, 20 µL of DMSO was added to the reaction products in $D_2O$. The relative areas under the peaks associated with each reagent enabled estimation of formation of 0.48 mmol of $HCOO^-$ after 30 min of light exposure. The enthalpy of formation of sodium formate is known to be –666.5 kJ/mol. Further, $NaHCO_3$ has an enthalpy of formation of –950.8 kJ/mol. The conversion of 1 mole of bicarbonate to formate thus implied the storage of 284.3 kJ of energy. From this it was estimated that the chemical energy stored into the reactor was 138.48 J. This corresponds to a 20.2% energy conversion efficiency. This is significantly greater than through terrestrial photosynthesis.

All efficiencies were calculated using an AM1.5 solar simulators as a light source. Total solar wattage of AM1.5 is 1000 $W/m^2$. Amount of solar energy exposed in effective area of the reactor is 684.238 J. Detailed calculation has been given below—

Total solar wattage of AM1.5 sunlight=1000 $W/m^2$
Inner radius (r)=1.1 cm
Area of the reactor=3.801 $cm^2$
Total incident of solar wattage=0.3801 W
Total solar energy absorbed on the reactor=0.3801*30*60=684.238 J
From $^1H$ NMR with internal standard calibration,
The amount of formate formed=0.000487084 Mole
The desired reaction is $2NaHCO_3=2\ HCOONa+O_2$
Heat of formation of $NaHCO_3$=–950.8 kJ/Mole
Heat of formation of $HCOONa$=–666.5 kJ/Mole
Total energy formation in the reaction=284.3 kJ/Mole
Total energy formation in the reaction flask=138.48 J
Calculated efficiency=(138.48/684.238)*100=20.2%

Therefore, the NCs of the present subject matter can convert carbon dioxide in the form of sodium bicarbonate/sodium carbonate into formate as well as other molecules with carbon-carbon bonds such as sodium acetate. The products so formed can be used as fuel, for example, for running internal combustion engines.

Turn over number for this reduction process was estimated and was found to have a lower bound of $2\times10^6$. An estimate of turnover number was made as follows. 48 mg of $CuAlS_2/ZnS$ NCs were deposited on the walls of a glass vial. 20 ml of an aqueous solution containing 1.86 g of sodium bicarbonate was introduced into the reactor. The solution was exposed to white light for 46 hours. $^{13}C$ NMR spectra of the resultant substance were determined using the standard procedure.

Figure 9:
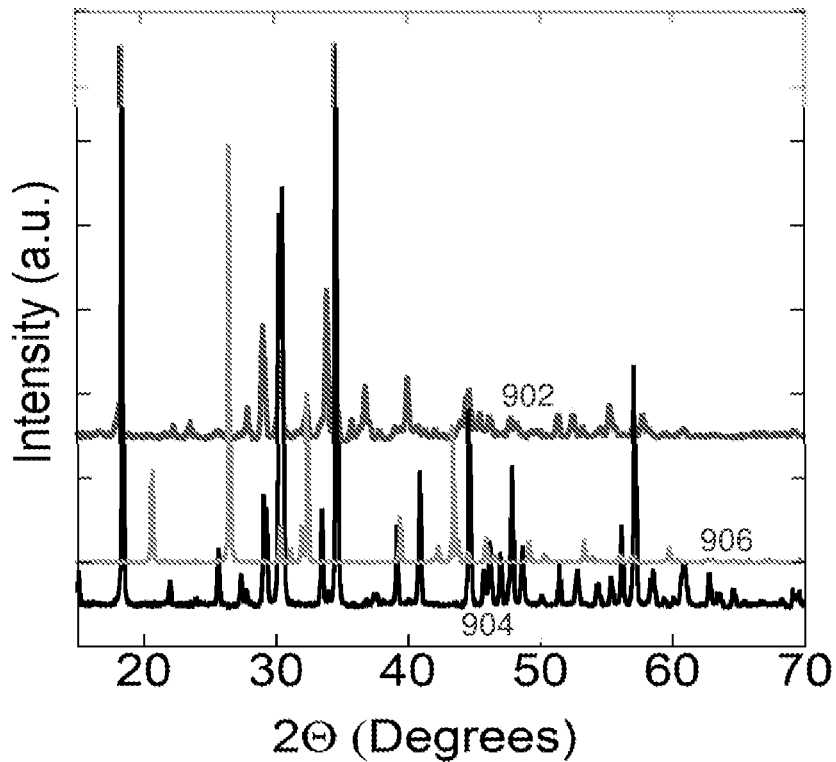
FIG. 9 depicts XRD pattern of a gram scale reduced bicarbonate product with comparison of standard sodium bicarbonate and sodium formate salts, in accordance with an implementation of the present subject matter.
Figure 10:
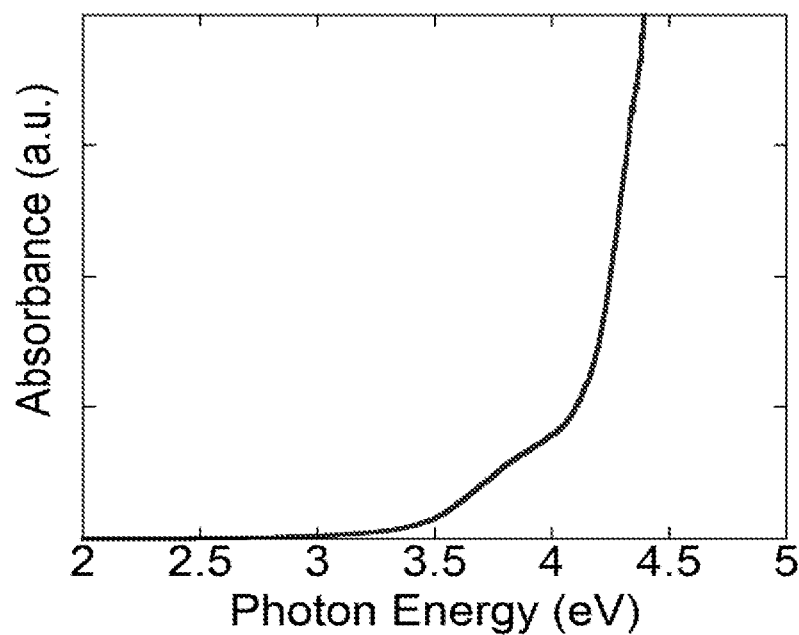
FIG. 10 illustrates absorption spectra of pure $CuAlS_2$, in accordance with an implementation of the present subject matter.
Figure 11:
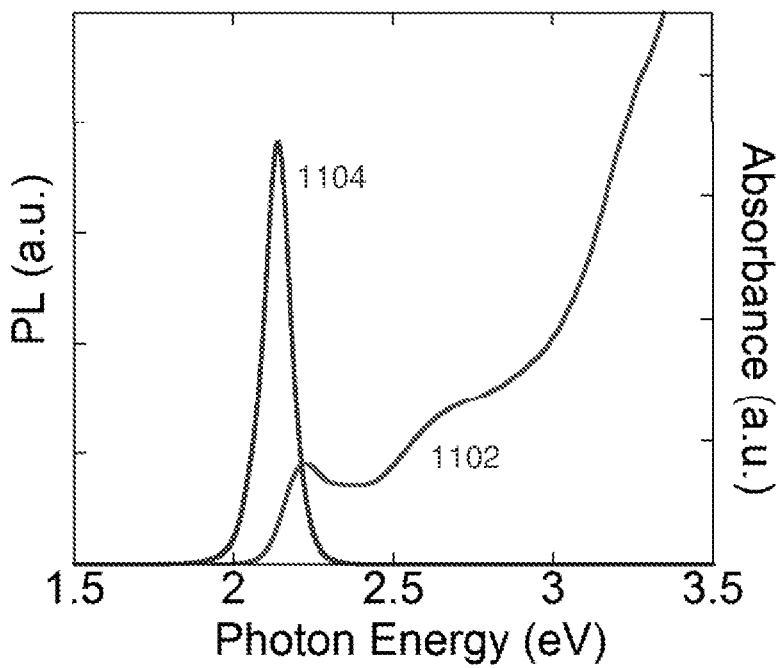
FIG. 11 illustrates absorption and emission spectra of CdSe/ZnS NCs, in accordance with an implementation of the present subject matter.

FIG. 9 depicts XRD pattern of a gram scale reduced bicarbonate product (line 902) with comparison of pure sodium bicarbonate (line 904) and pure sodium formate salts (line 906), in accordance with an implementation of the present subject matter. FIG. 10 illustrates absorption spectra of pure $CuAlS_2$, in accordance with an implementation of the present subject matter. FIG. 11 illustrates absorbance 1102 and emission 1104 spectra of CdSe/ZnS NCs, in accordance with an implementation of the present subject matter.

Figure 12:
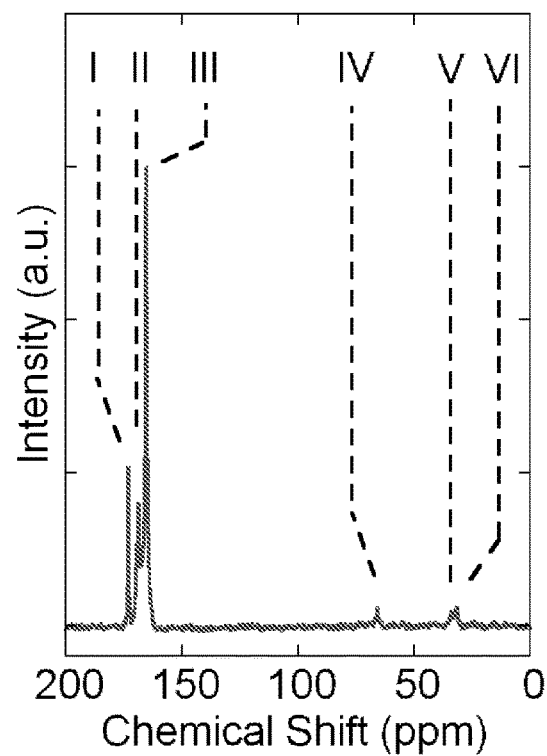
FIG. 12 illustrates $^{13}C$ solid state NMR of reduced bicarbonate, in accordance with an implementation of the present subject matter.

It was observed that after 46 hours of light exposure, the bicarbonate signal is suppressed, while new features corresponding to FIG. 12 curve [I] are observed. This also provided a lower bound to the catalytic turnover number. As a gram ratio, the turnover number was thus in excess of 39. The more conventional molar turnover number was in excess of $2.2\times10^6$ with respect to the moles of bicarbonate reduced per mole of NC. These numbers were confirmed using powder XRD that confirms complete bicarbonate degradation. It is to be noted that these large turnover numbers paved the route for the photosynthesis of gram amounts of organic compounds using only tens of milligrams of NCs. For example, the inset to FIG. 7e shows a photograph of 1.2 g of product that was obtained from the above reaction. The reaction mixture was separated from the NCs by decantation. The product was then isolated from solution by allowing water to evaporate.

Example 4.4: Study of Progression of Reaction

Further, analysis was conducted to study the progress of the reaction. All the reaction was carried in sealed glass tube. At first a known amount of the NCs (26 mg) was taken in hexane solution. Then the hexane was evaporated through rotavapor apparatus under low pressure. The NCs were formed a thick layer in the inner side of the reaction tube wall. Then required amount of the sodium bicarbonate (41 mg) was dissolved in 0.5 ml of deionized water. In all cases the reaction was carried out using a 100 W LED light that delivers 45 mW/cm$^2$ of white light at the reactor. To know the progress of the reaction, it was monitored in different time like 8, 14 and 26 hours. The desired reaction was analyzed through the Solid state and Liquid state NMR. For liquid state 10 mg of the reduced product was dissolved in D$_2$O as a solvent. Both $^1$H and $^{13}$C NMR were taken to analyze the product.

Figure 13:
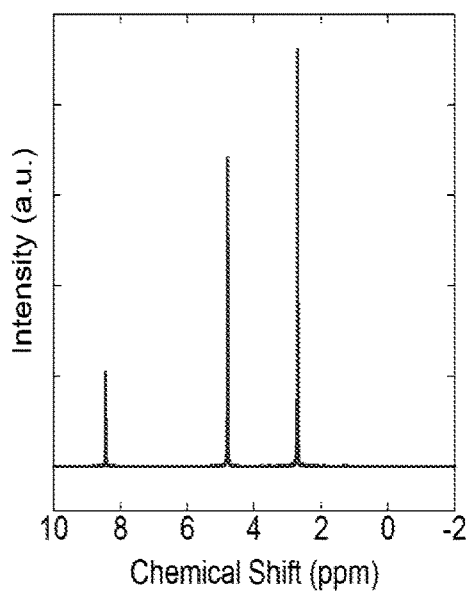
FIG. 13 illustrates $^1H$ NMR of products using $CuAlS_2$/ZnS NCs for 30 mins showing an efficiency of 18.6%, in accordance with an implementation of the present subject matter.
Figure 14:
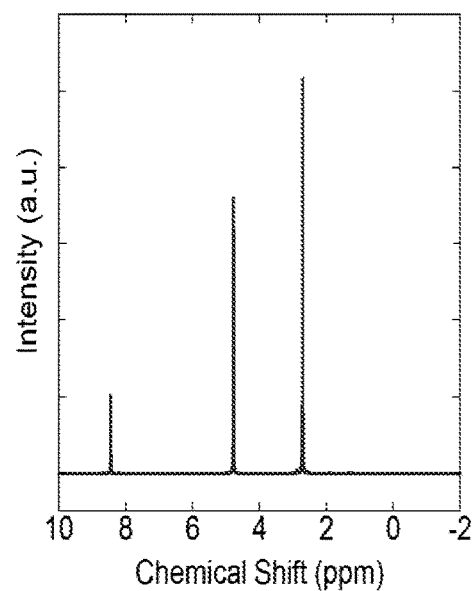
FIG. 14 illustrates $^1H$ NMR of products using $CuAlS_2$/ZnS NCs for 30 mins showing an efficiency of 14.8%, in accordance with an implementation of the present subject matter.
Figure 15:
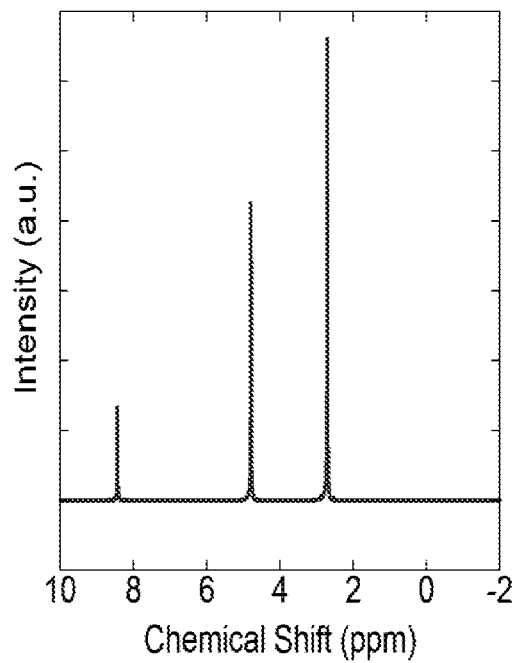
FIG. 15 illustrates $^1H$ NMR of products using $CuAlS_2$/ZnS NCs for 30 mins showing an efficiency of 16.6%, in accordance with an implementation of the present subject matter.
Figure 16:
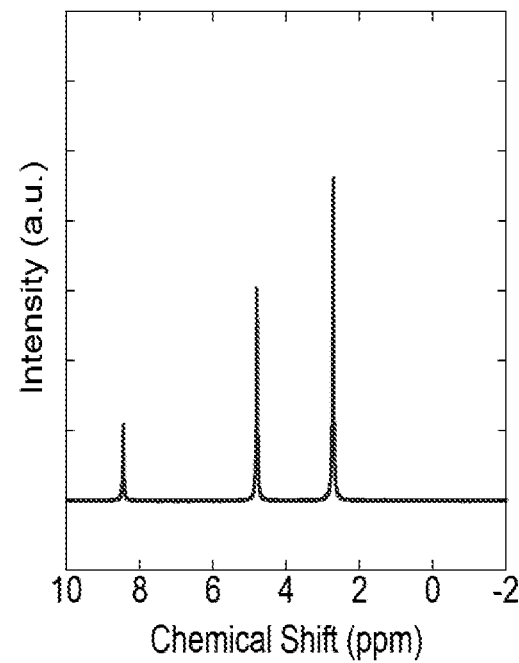
FIG. 16 illustrates $^1H$ NMR of products using $CuAlS_2$/ZnS NCs for 30 mins showing an efficiency of 18.5%, in accordance with an implementation of the present subject matter.
Figure 17:
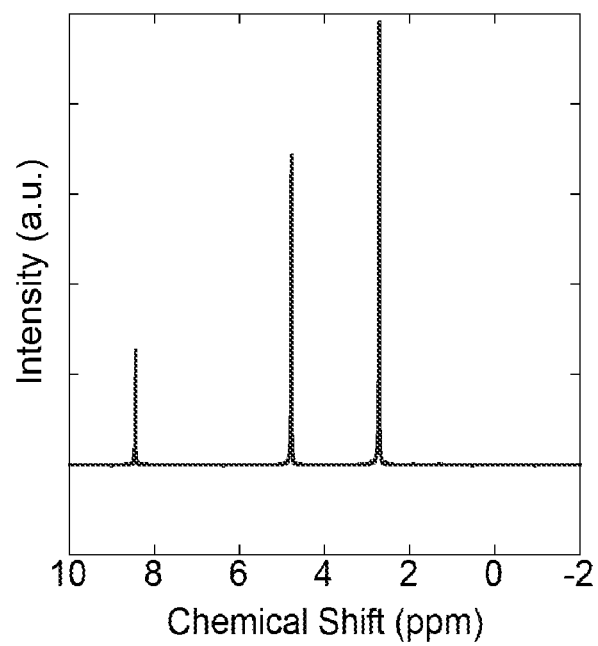
FIG. 17 illustrates $^1H$ NMR of products using $CuAlS_2$/ZnS NCs for 30 mins showing an efficiency of 20.2%, in accordance with an implementation of the present subject matter.

FIG. 13 shows $^1$H NMR of the products using CuAlS$_2$/ZnS NCs at 30 mins which shows an efficiency of 18.6%. FIG. 14 shows $^1$H NMR of the products using CuAlS$_2$/ZnS NCs at 30 mins which shows an efficiency of 14.8%. FIG. 15 shows $^1$H NMR of the products using CuAlS$_2$/ZnS NCs at 30 mins which shows an efficiency of 16.6%. FIG. 16 shows $^1$H NMR of the products using CuAlS$_2$/ZnS NCs at 30 mins which shows an efficiency of 18.5%. FIG. 17 shows $^1$H NMR of the products using CuAlS$_2$/ZnS NCs at 30 mins which shows an efficiency of 20.2%. To obtain the efficiencies from FIGS. 13-17, relative areas under the peaks are determined, the areas are correlated with amount of product formed, and enthalpy of formation of the product is correlated with enthalpy of formation of reactant, and the efficiencies are calculated as explained previously.

Figure 18:
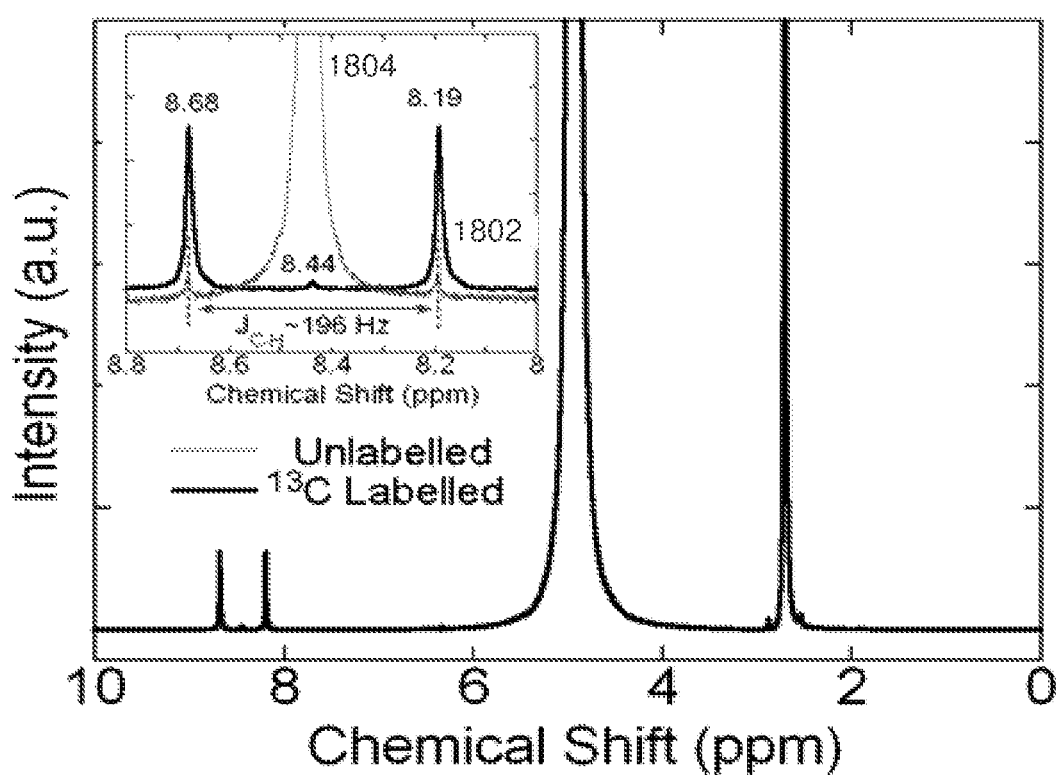
FIG. 18 illustrates results of chemical shift studies, in accordance with an implementation of the present subject matter.

FIG. 18 depicts further results of chemical shift studies, in accordance with an implementation of the present subject matter. $^{13}$C (98%) Labeled Sodium Bicarbonate was purchased from Sigma-Aldrich. The bicarbonate photoreduction reaction was undertaken in following usual protocols. The product $^1$H NMR is shown in FIG. 18 (line 1802). $^{13}$C enrichment of the products is confirmed through the observation of enhanced $^1$H-$^{13}$C coupling peaks. For comparison, a typical NMR for formate produced from unlabeled bicarbonate is also shown (line 1804). This confirms bicarbonate to formate conversion.

Example 4.5: Reduction Reaction Using Various Starting Salts

Figure 19A:
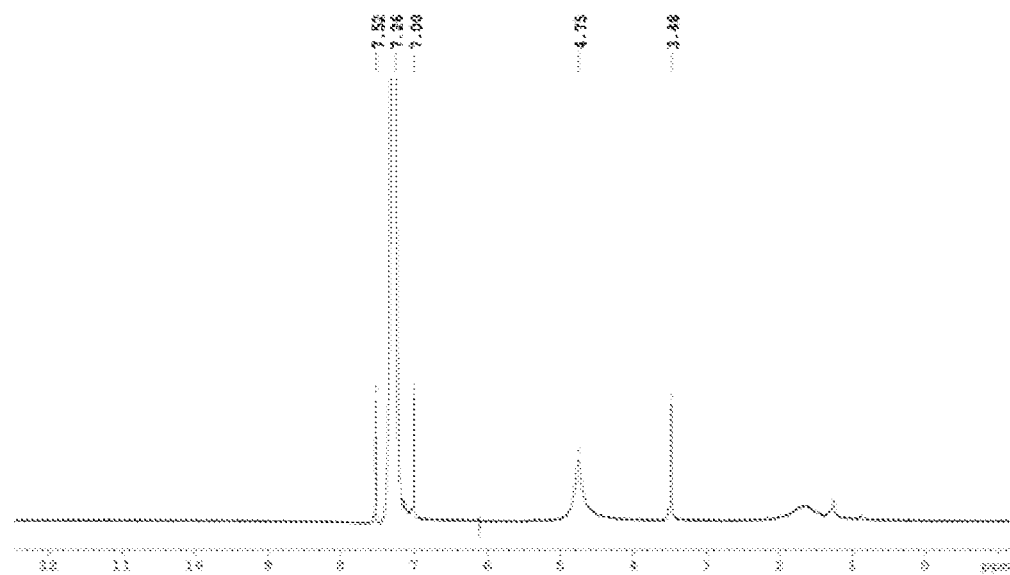
FIG. 19a-19d illustrates $^1H$ NMR of products using $CuAlS_2$/ZnS NCs for 96, 96, 120 and 120 hours, respectively, in accordance with an implementation of the present subject matter.
Figure 19B:
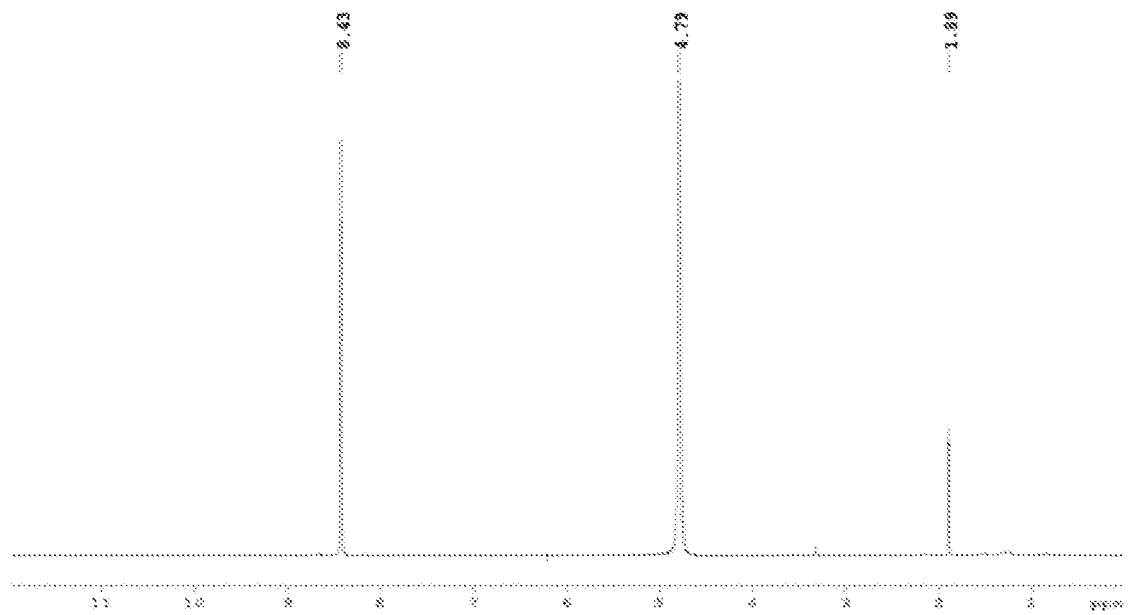
Figure 19C:
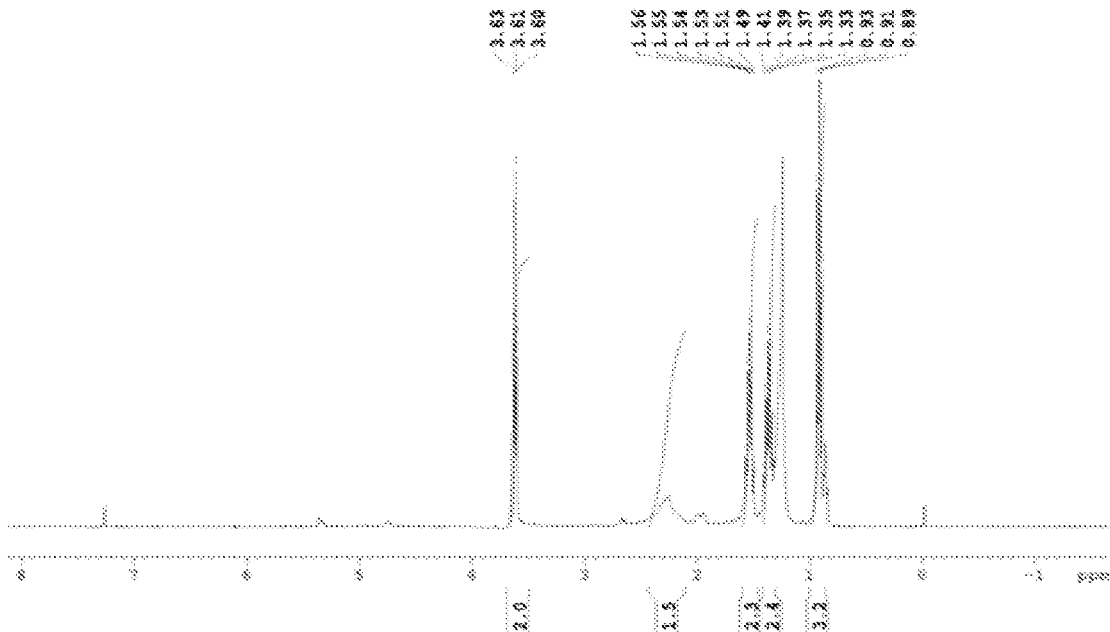
Figure 19D:
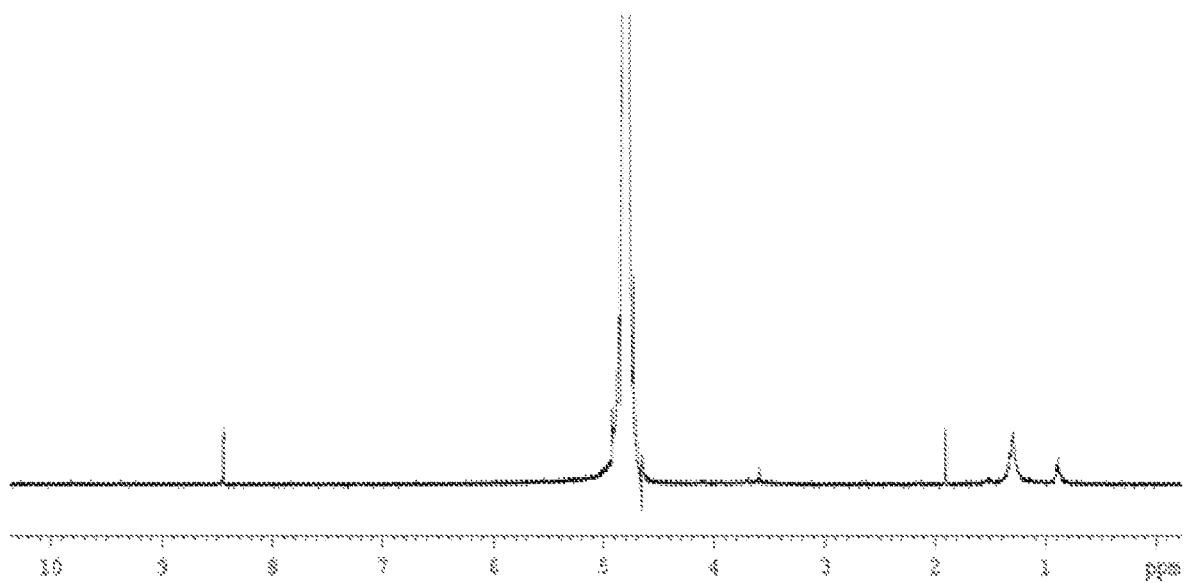

FIG. 19a-d depicts $^1$H NMR of products using various starting salts, in accordance with an implementation of the present subject matter. FIG. 19a depicts $^1$H NMR of methanol (3.48 and 4.75 ppm) extracted into CDCl$_3$ when starting from sodium bicarbonate and Basic Zinc Carbonate (Zn (OH)$_2$.ZnCO$_3$.xH$_2$O) and using reaction schemes as described previously. FIG. 19b depicts $^1$H NMR of acetate (1.89 ppm) extracted into D$_2$O when starting from sodium bicarbonate and using the reaction scheme as described previously. From FIG. 19b, formate is also observable at 8.43 ppm. FIG. 19c depicts $^1$H NMR of butanol extracted into CDCl$_3$ when starting from sodium acetate and using the reaction scheme as described previously, in accordance with an implementation of the present subject matter. FIG. 19d depicts $^1$H NMR of formate, acetate and ethanol extracted into D$_2$O when starting from sodium bicarbonate using the reaction scheme as described previously. FIGS. 19a and b represent proton NMR data in D$_2$O (aqueous fraction) and FIGS. 19c and d represent the proton NMR data in CDCl$_3$ (organic fraction) of the reaction mixture.

The NC shows absorption of light at energies as low as 1.5 eV, allowing for the absorption of a large amount of sunlight. It also exhibits a cross-section of >10$^{-17}$ at a bandgap of 1.8-3 eV. It provides a staggered offset structure where the electron relaxes into a zinc chalcogenide upon cooling of an exciton. It also exhibits an unprecedented photochemical activity in terms of reducing carbon dioxide. A large turnover number in excess of 2 million per NC is observed. Approximately 1.86 grams of sodium bicarbonate was reduced starting from only ~40 mg of NCs at an efficiency comparable to photosynthesis. A maximum observed energy conversion efficiency of 20.2% in the NC based device. A mean efficiency of 17.7% was observed.

Further gram scale reduction of sodium bicarbonate was conducted using the NCs of the present subject matter. Further results show a production of 712 mg of sodium formate using only ~'100 mg of CuAlS$_2$/ZnS NCs within 48 hours of irradiation with white LED light at a power of 45 mW/cm$^2$. This provides a lower estimate in excess of 75000 as the turnover number for the formation of formate.

The semiconductor nanocrystal 100 of the present subject matter provides light absorption at low energies. The semiconductor nanocrystal 100 also exhibits high photochemical activity and helps in conversion of salts selected from the group consisting of carbonates, bicarbonates, and carboxylates to organic compounds without using a catalyst, co-catalyst, promoter or sacrificial agent. A mean energy conversion efficiency of 17.6% was observed.

Although the subject matter has been described in considerable detail with reference to certain examples and implementations thereof, other implementations are possible. As such, the scope of the present subject matter should not be limited to the description of the preferred examples and implementations contained therein.

We claim:

1. A method for preparing a semiconductor nanocrystal comprising:
    preparing a core, wherein the core is a copper aluminium sulfide core, wherein preparing the core comprises:
        preparing a core anion precursor by contacting sulfur with a mixture of oleylamine and octadecene in an inert atmosphere at a temperature range of 25° C. -300° C. to obtain the core anion precursor;
        preparing a core cation precursor by contacting a copper salt and aluminium salt with a liquid medium comprising an organic acid in an inert atmosphere at 85-285° C. for a time period of 10-20 minutes to obtain the core cation precursor; and
        contacting the core anion precursor with the core cation precursor to obtain the core; by:
    contacting the core cation precursor with an organic thiol to obtain a first mixture;
    and contacting the core anion precursor with the first mixture at a temperature range of 160-285° C. to obtain the copper aluminium sulfide core; and
    preparing a shell enclosing the core, wherein the shell is a zinc sulfide shell, wherein preparing the shell comprises:
    heating the core to a temperature in a range of 150-280° C.; and
    contacting the core with shell precursors to obtain the semiconductor nanocrystal, wherein the optical cross section of the semiconductor nanocrystal is in a range of $10^{-31\,17}$ cm$^2$-10$^-$ cm$^2$ in a 2-3 eV region, and wherein the core is less than 2 nanometers from an outer surface of the shell in at least one region of the semiconductor nanocrystal.

2. A method for photosynthesis of organic compounds, the method comprising:

contacting a plurality of semiconductor nanocrystals with a dispersion of salts selected from the group consisting of carbonates, bicarbonates, and carboxylates in water to obtain a first composition, wherein each of the plurality of semiconductor nanocrystals comprises:

a core fabricated from a first semiconductor; and a shell fabricated from a second semiconductor, wherein the optical cross section of the semiconductor nanocrystal is in a range of $10^{-17}$ cm$^2$-$10^{-12}$ cm$^2$ in a 2-3 eV region, and wherein the core is less than 2 nanometers from an outer surface of the shell in at least one region of the semiconductor nanocrystal; and irradiating the first composition with light to obtain the organic compounds.

3. The method as claimed in claim 2, wherein products of irradiating the first composition are organic compounds selected from the group comprising formate, acetate, methanol and butanol.

4. The method as claimed in claim 2, wherein the contacting comprises:

contacting salts with water to obtain the dispersion; and adding the plurality of semiconductor nanocrystals to the dispersion.

5. The method as claimed in claim 2, wherein the contacting comprises:

depositing the plurality of semiconductor nanocrystals on an inner surface of a vessel to obtain a coated vessel;

contacting the salts with water to obtain the dispersion; and adding the dispersion to the coated vessel.

6. The method as claimed in claim 2, wherein concentration of salts in the dispersion is in a range of 1 micromolar to 10 molars.

7. The method as claimed in claim 2, wherein the dispersion comprises a first fraction of salts soluble in water and a second fraction of salts insoluble in water.

8. The method as claimed in claim 2, wherein the method comprises providing the plurality of semiconductor nanocrystals as a plurality of layers on an inert substrate.

9. The method as claimed in claim 8, wherein the inert substrate comprises a granular material with a grain size in a range of 50 nm to 1 cm, wherein the inert substrate is selected from the group consisting of glass, silicate glass, non-silicate glass, silica, activated silica, zeolite, sapphire, alumina, calcite, calcium fluoride, magnesium fluoride, barium fluoride, mica, teflon, anodized aluminum, ZnO, TiO$_2$, and combinations thereof.

* * * * *

UNITED STATES PATENT AND TRADEMARK OFFICE
CERTIFICATE OF CORRECTION

PATENT NO. : 11,217,662 B2
APPLICATION NO. : 16/609125
DATED : January 4, 2022
INVENTOR(S) : Anshu Pandey It is certified that error appears in the above-identified patent and that said Letters Patent is hereby corrected as shown below:

In the Claims

Column 15, Line 1, Claim 1:
"of $10^{-31}$ $^{17}$ cm$^2$-10$^-$ cm$^2$ in a 2-3 eV region, and wherein" should read --of $10^{-17}$ cm$^2$ - $10^{-12}$ cm$^2$ in a 2-3 eV region, and wherein--.

Signed and Sealed this
Sixth Day of September, 2022

Katherine Kelly Vidal
*Director of the United States Patent and Trademark Office*